United States Patent
Lai et al.

(10) Patent No.: US 12,176,301 B2
(45) Date of Patent: Dec. 24, 2024

(54) PACKAGE STRUCTURE AND METHOD FOR FORMING THE SAME

(71) Applicant: Taiwan Semiconductor Manufacturing Company, Ltd., Hsinchu (TW)

(72) Inventors: Po-Chen Lai, Hsinchu County (TW); Chin-Hua Wang, New Taipei (TW); Ming-Chih Yew, Hsinchu (TW); Li-Ling Liao, Hsinchu (TW); Tsung-Yen Lee, Changhua County (TW); Po-Yao Lin, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/328,913

(22) Filed: Jun. 5, 2023

(65) Prior Publication Data
US 2023/0326879 A1 Oct. 12, 2023

Related U.S. Application Data

(63) Continuation of application No. 17/350,293, filed on Jun. 17, 2021, now Pat. No. 11,705,406.

(51) Int. Cl.
*H01L 21/683* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............... H01L 23/562; H01L 21/4853; H01L 21/4857; H01L 21/563; H01L 21/565; H01L 21/568; H01L 21/6835; H01L 23/16; H01L 23/3128; H01L 23/3135; H01L 23/5383; H01L 23/5386; H01L 24/08;
(Continued)

(56) References Cited

U.S. PATENT DOCUMENTS 7,161,242 B2 * 1/2007 Yamasaki ......... H01L 23/49822
257/E21.597
7,247,950 B2 * 7/2007 Fujisawa ................. H01L 24/82
257/E25.011
(Continued)

*Primary Examiner* — Vu A Vu
(74) *Attorney, Agent, or Firm* — McClure, Qualey & Rodack, LLP

(57) ABSTRACT

A package structure is provided. The package structure includes a semiconductor die bonding on a first surface of a redistribution structure through first bonding elements, and a wall structure bonding on the first surface of the redistribution structure through second bonding elements. The wall structure includes a plurality of partitions laterally arranged in a discontinuous ring, and the semiconductor die is located within the discontinuous ring. The package structure also includes a substrate on a second surface of the redistribution structure through third bonding elements and in electrical connection with the semiconductor die.

20 Claims, 25 Drawing Sheets

(51) Int. Cl.
*H01L 21/56* (2006.01)
*H01L 23/00* (2006.01)
*H01L 23/16* (2006.01)
*H01L 23/31* (2006.01)
*H01L 23/538* (2006.01)

(52) U.S. Cl.
CPC .......... *H01L 21/563* (2013.01); *H01L 21/565* (2013.01); *H01L 21/568* (2013.01); *H01L 21/6835* (2013.01); *H01L 23/16* (2013.01); *H01L 23/3128* (2013.01); *H01L 23/3135* (2013.01); *H01L 23/5383* (2013.01); *H01L 23/5386* (2013.01); *H01L 24/08* (2013.01); *H01L 2221/68372* (2013.01); *H01L 2224/16227* (2013.01); *H01L 2924/18161* (2013.01); *H01L 2924/3512* (2013.01)

(58) Field of Classification Search
CPC . H01L 2221/68372; H01L 2224/16227; H01L 2924/18161; H01L 2924/3512; H01L 23/49816; H01L 23/49838; H01L 23/5385; H01L 25/0655; H01L 2221/68345; H01L 23/3121; H01L 23/49811; H01L 23/49827
USPC .......................................................... 257/730
See application file for complete search history.

(56) References Cited

U.S. PATENT DOCUMENTS

| | | | |
|---|---|---|---|
| 8,633,598 | B1 | 1/2014 | St. Amand |
| 8,779,599 | B2 * | 7/2014 | Lin .................. H01L 21/561 257/725 |
| 9,000,584 | B2 | 4/2015 | Lin |
| 9,048,222 | B2 | 6/2015 | Hung |
| 9,048,233 | B2 | 6/2015 | Wu |
| 9,064,879 | B2 | 6/2015 | Hung |
| 9,093,337 | B2 * | 7/2015 | Hwang ............. H01L 21/568 |
| 9,111,949 | B2 | 8/2015 | Yu |
| 9,263,511 | B2 | 2/2016 | Yu |
| 9,281,254 | B2 | 3/2016 | Yu |
| 9,355,997 | B2 * | 5/2016 | Katkar ............. H01L 23/3135 |
| 9,368,460 | B2 | 6/2016 | Yu |
| 9,372,206 | B2 | 6/2016 | Wu |
| 9,496,189 | B2 | 11/2016 | Yu |
| 9,735,131 | B2 | 8/2017 | Su |
| 10,043,769 | B2 * | 8/2018 | Shih ................. H01L 23/562 |
| 10,153,222 | B2 * | 12/2018 | Yu .................... H01L 25/0657 |
| 10,629,454 | B2 | 4/2020 | Yeh |
| 11,508,707 | B2 * | 11/2022 | Su .................... H01L 23/3128 |
| 2012/0159118 | A1 | 6/2012 | Wong |
| 2013/0284796 | A1 | 10/2013 | Nagar |
| 2018/0301418 | A1 | 10/2018 | Chang Chien |
| 2018/0348434 | A1 | 12/2018 | Yim |
| 2019/0006341 | A1 * | 1/2019 | Lin .................... H01L 21/563 |
| 2019/0139786 | A1 | 5/2019 | Yeh |
| 2019/0348343 | A1 * | 11/2019 | Kwon ............... H01L 23/3737 |
| 2020/0006252 | A1 | 1/2020 | Yu |
| 2020/0036557 | A1 | 1/2020 | Kneißl |
| 2021/0398908 | A1 | 12/2021 | Jin |

* cited by examiner

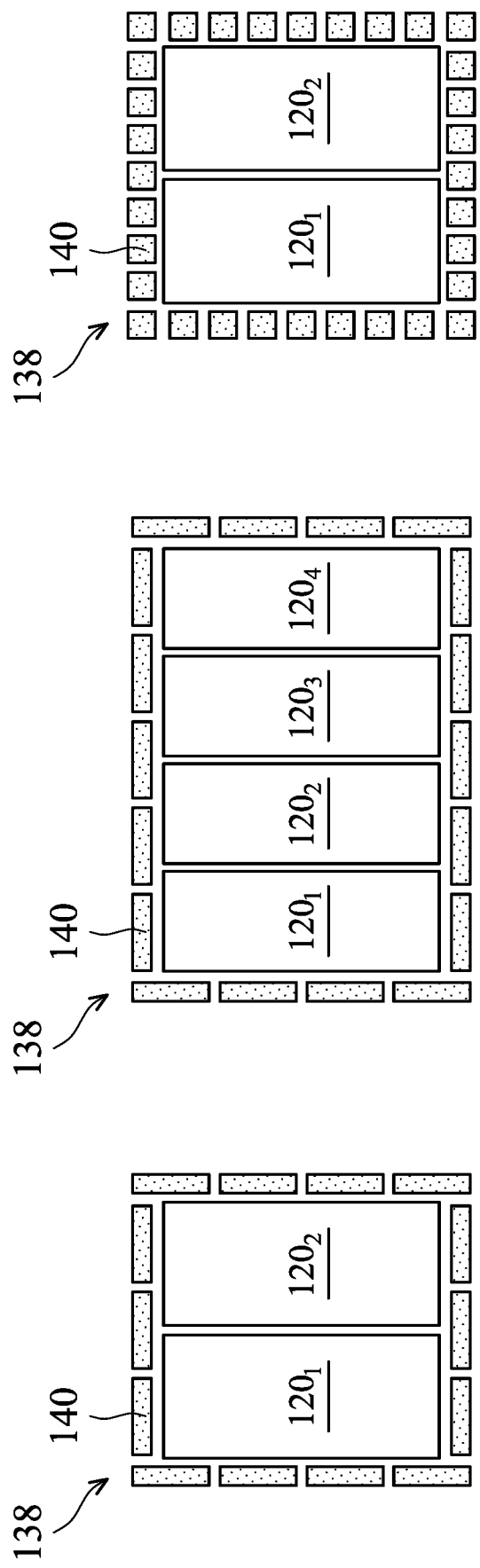
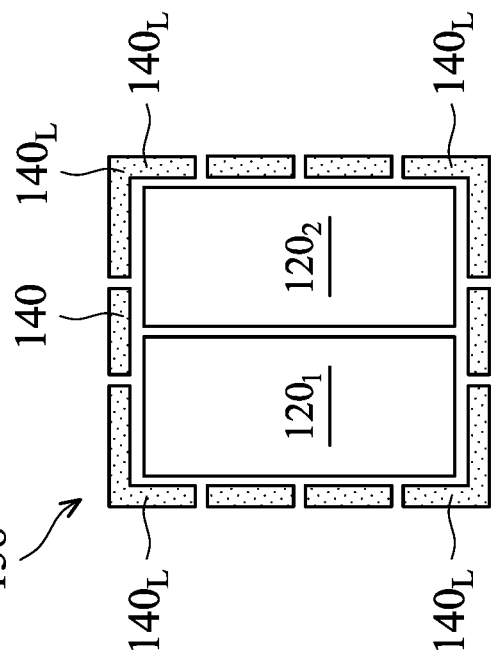
FIG. 6-1
FIG. 6-2
FIG. 6-3
FIG. 6-4

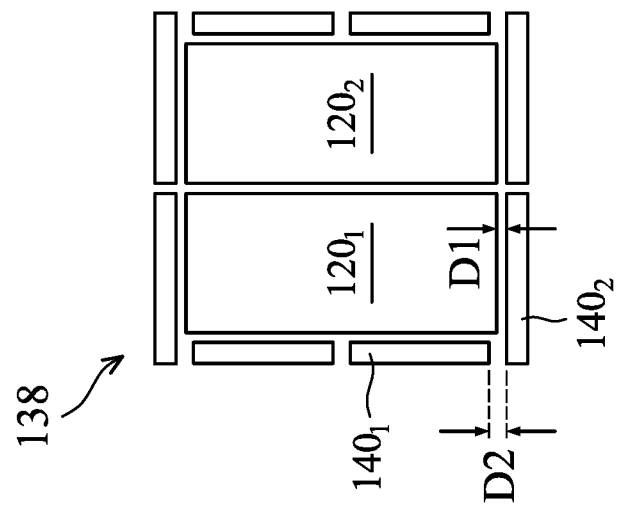
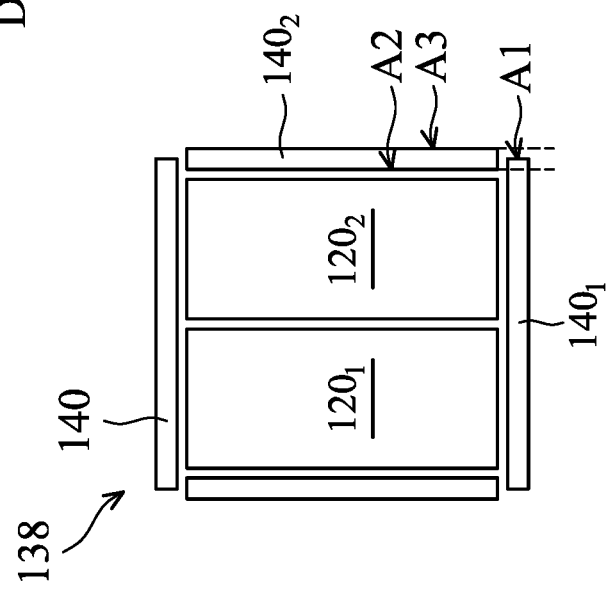
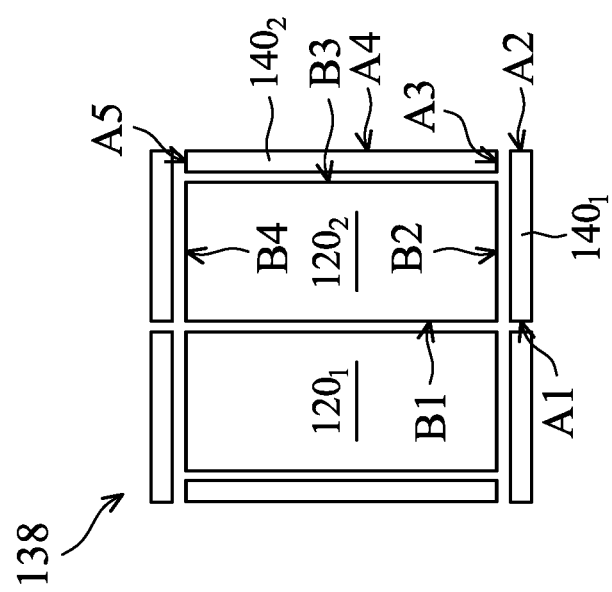
FIG. 6-6
FIG. 6-7
FIG. 6-5

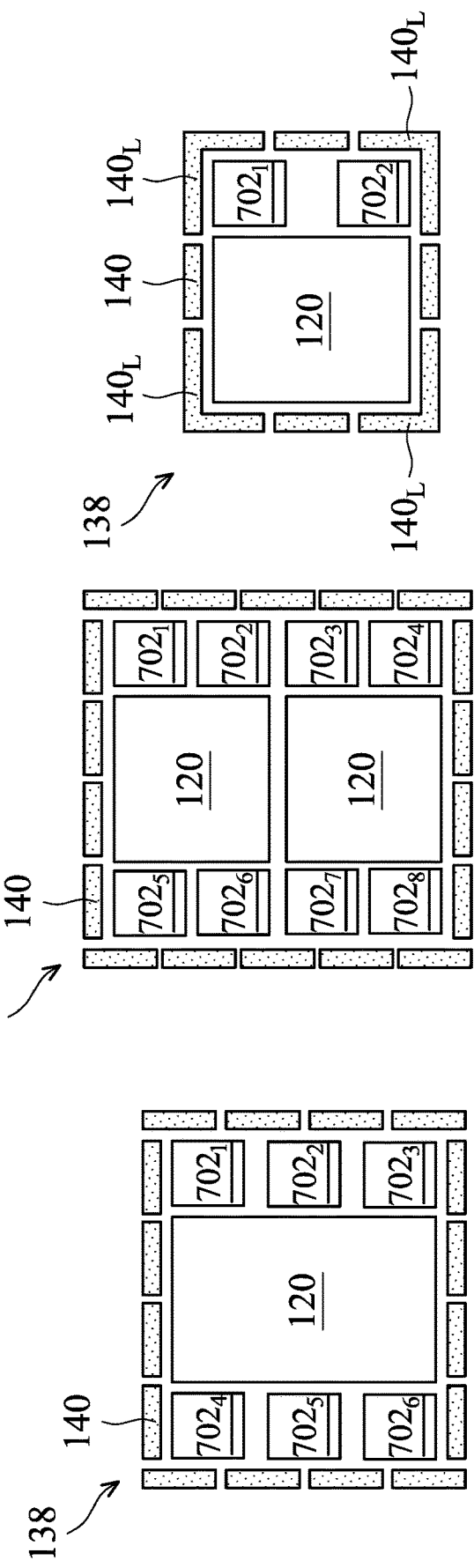

PACKAGE STRUCTURE AND METHOD FOR FORMING THE SAME

PRIORITY CLAIM AND CROSS-REFERENCE

This application is a Continuation Application of U.S. application Ser. No. 17/350,293, filed on Jun. 17, 2021, entitled "PACKAGE STRUCTURE AND METHOD FOR FORMING THE SAME," (now U.S. Pat. No. 11,705,406, issued Jul. 18, 2023), which is incorporated herein by reference in its entirety.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize a smaller area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1B-1 is a plan view illustrating conductive features, in accordance with some embodiments of the disclosure.

FIG. 1D-1 is a plan view illustrating bonding elements, a semiconductor die and a wall structure, in accordance with some embodiments of the disclosure.

FIG. 5-1 is a plan view illustrating bonding elements, semiconductor dies and a wall structure, in accordance with some embodiments of the disclosure.

FIGS. 6-1, 6-2, 6-3, 6-4, 6-5, 6-6 and 6-7 are plan views illustrating various configurations of semiconductor dies and a wall structure, in accordance with some embodiments of the disclosure.

FIG. 7 is a modification of the cross-sectional view of FIG. 1L, in accordance with some embodiments of the disclosure.

FIG. 7-1 is a plan view illustrating bonding elements, a semiconductor die, a package and a wall structure, in accordance with some embodiments of the disclosure.

FIGS. 9-1, 9-2, 9-3, 9-4 and 9-5 are plan views illustrating various configurations of semiconductor dies, packages and a wall structure, in accordance with some embodiments of the disclosure.

DETAILED DESCRIPTION

Figure 1A:
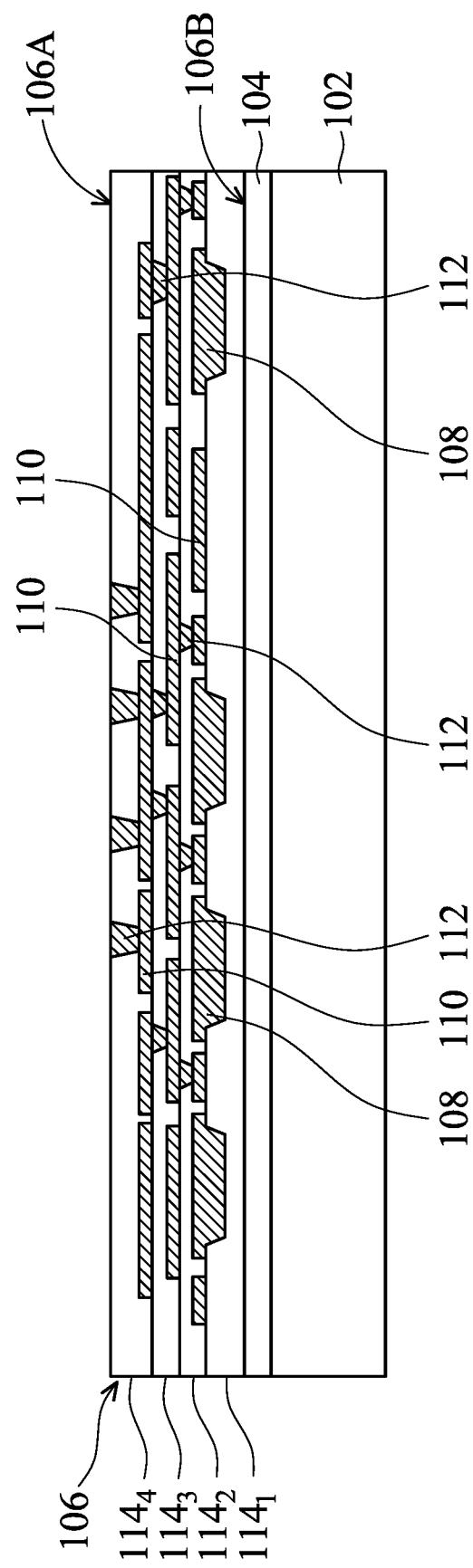
FIGS. 1A through 1L are cross-sectional views illustrating the formation of a package structure at various intermediate stages, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of a package structure are provided. The package structure may include a semiconductor die bonded to a redistribution structure, a wall structure including a plurality of partitions separated from one another and laterally surrounding the semiconductor die, and an underfill material between the semiconductor die and the wall structure. The wall structure may reduce or mitigate the stress induced by bonding elements and applied to the underfill material, thereby reducing the risk of cracking of the molding compound and the underfill material. As a result, the performance and reliability of the package structure may be improved.

FIGS. 1A through 1L are cross-sectional views illustrating the formation of a package structure at various intermediate stages, in accordance with some embodiments of the disclosure. A carrier substrate 102 is received or provided, as shown in FIG. 1A, in accordance with some embodiments. In some embodiments, the carrier substrate 102 is a ceramic substrate, a glass substrate, a polymer substrate, a semiconductor substrate, or another suitable substrate.

An adhesive tape 104 is disposed over the carrier substrate 102, as shown in FIG. 1A, in accordance with some embodiments. In some embodiments, the adhesive tape 104 is sensitive to an energy beam irradiation. In some embodiments, the adhesive tape 104 is a release layer that is made of or includes a light-to-heat conversion (LTHC) material. For example, a laser beam may be used to irradiate the adhesive tape 104 in a subsequent process. The irradiation may allow a package structure formed over the adhesive tape 104 to be separated from the carrier substrate 102.

A redistribution structure 106 is formed over the adhesive tape 104, as shown in FIG. 1A, in accordance with some embodiments. The redistribution structure 106 is configured for routing, which enables the formation of a package structure with fan-out features. The redistribution structure 106 may also be referred to as an interposer. The redistribution structure 106 has a bottom surface 106B facing the carrier substrate 102 and a top surface 106A facing away from the carrier substrate 102, in accordance with some embodiments.

In some embodiments, the redistribution structure 106 includes multiple insulating layers such as insulating layers $114_1$, $114_2$, $114_3$ and $114_4$ and multiple conductive features such as conductive features 108, 110 and 112 formed in the insulating layers. Although FIG. 1A shows four insulating layers $114_1$-$114_4$, the number of the insulating layers is not limited thereto and the redistribution structure 106 may include less or more the insulating layers.

In some embodiment, the conductive features 108 are under-bump metallurgies (UBMs). In some embodiment, conductive features 108 are surrounded by the insulating layer $114_1$. In some embodiments, the conductive features 108 are to be exposed from or protrude from the bottom surface of the redistribution structure 106 and used to hold or receive one or more bonding elements.

In some embodiments, the conductive features 108 are made of or include metallic material such as titanium, copper, nickel, tantalum, vanadium, chromium, gold, tungsten, an alloy thereof, a multi-layer thereof, or a combination thereof. In some embodiments, the conductive features 108 are made of non-solder metallic material.

In some embodiments, the conductive features 110 include conductive pads, conductive lines and/or conductive traces and configured to provide horizontal electrical routing. In some embodiments, the conductive features 112 are conductive vias and configured to provide vertical electrical routing. In some embodiments, the conductive features 110 are surrounded by the insulating layers $114_2$-$114_4$ and electrically coupled to the conductive features 108 and the conductive features 112.

In some embodiments, the conductive features 112 surrounded by the insulating layer $114_4$ are exposed from and/or protruding from the top surface 106A (of the insulating layer $114_4$) of the redistribution structure 106 and are used to hold or receive one or more bonding elements.

In some embodiments, the insulating layers 114 may be made of one or more polymer materials. The polymer material(s) may include polybenzoxazole (PBO), benzocyclobutene (BCB), polyimide (PI), epoxy-based resin, one or more other suitable polymer materials, or a combination thereof. In some embodiments, the polymer material is photosensitive. A photolithography process may therefore be used to form openings with desired patterns in the insulating layers $114_1$-$114_4$.

In some embodiments, the conductive features 110 and 112 are made of metallic material such as copper, aluminum, gold, palladium, cobalt, titanium, nickel, silver, graphene, one or more other suitable conductive materials, an alloy thereof, or a combination thereof. In some embodiments, the conductive features 110 and 112 are made of non-solder metallic material. In some embodiments, the conductive features 110 and 112 include multiple sub-layers. For example, each of the conductive features 110 and 112 contains multiple sub-layers including Ti/Cu, Ti/Ni/Cu, Ti/Cu/Ti, Al/Ti/Ni/Ag, other suitable sub-layers, or a combination thereof.

The formation of the redistribution structure 106 may involve multiple deposition processes, multiple patterning processes, and/or multiple planarization processes. The deposition processes may be used to form insulating layers and/or conductive layers. The deposition processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, a dry polishing process, one or more other applicable processes, or a combination thereof.

Figure 1B:
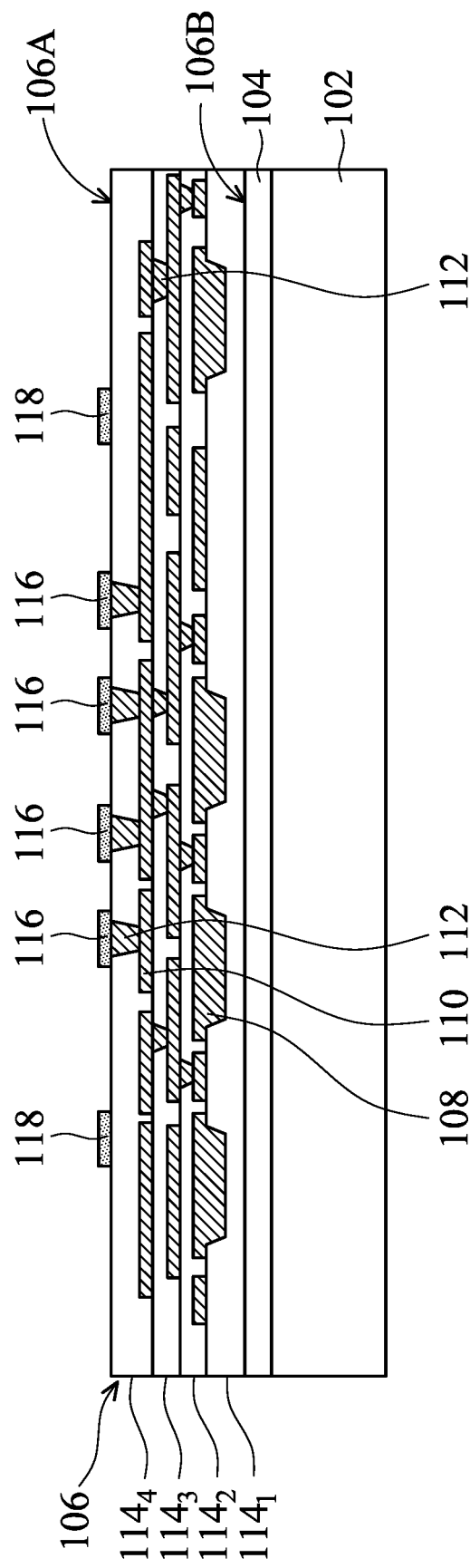

Conductive features 116 and 118 are formed over the top surface 106A of the redistribution structure 106, as shown in FIG. 1B, in accordance with some embodiments. In some embodiments, the conductive features 116 are formed on and in contact with the conductive features 112 while the conductive features 118 are not formed in contact with the conductive features 112. In alternative embodiments, the conductive features 118 are formed on and in contact with the conductive features 112.

In some embodiments, the conductive features 116 and 118 are Under-Bump Metallurgies (UBMs). In some embodiments, the conductive features 116 and 118 are used to hold or receive one or more bonding elements such as solder balls. In some embodiments, the conductive features 116 and 118 are made of or include metallic material such as titanium, copper, nickel, tantalum, vanadium, chromium, gold, tungsten, an alloy thereof, a multi-layer thereof, or a combination thereof. In some embodiments, the conductive features 116 and 118 are made of non-solder metallic material.

Figures 1, 1B:
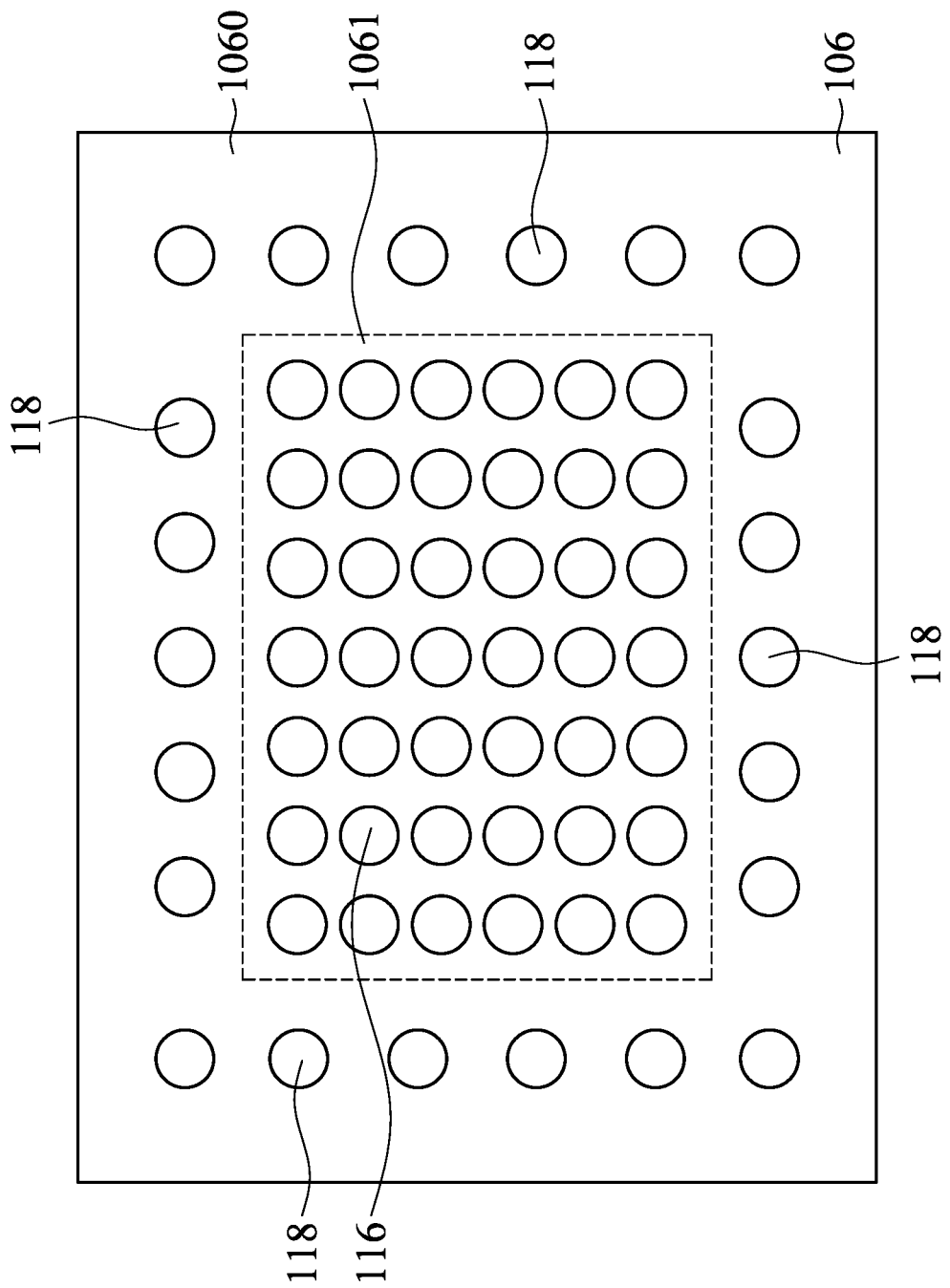

FIG. 1B-1 is a plan view illustrating conductive features 116 and 118, in accordance with some embodiments of the disclosure. In some embodiments, the conductive features 118 are disposed within a fan-out area 1060 of the redistribution structure 106 and the conductive features 116 are disposed within a fan-in area 1061 of the redistribution structure 106, as shown in FIG. 1B-1. The conductive features 118 are laterally arranged to surround the conductive features 116, in accordance with some embodiments.

Figure 1C:
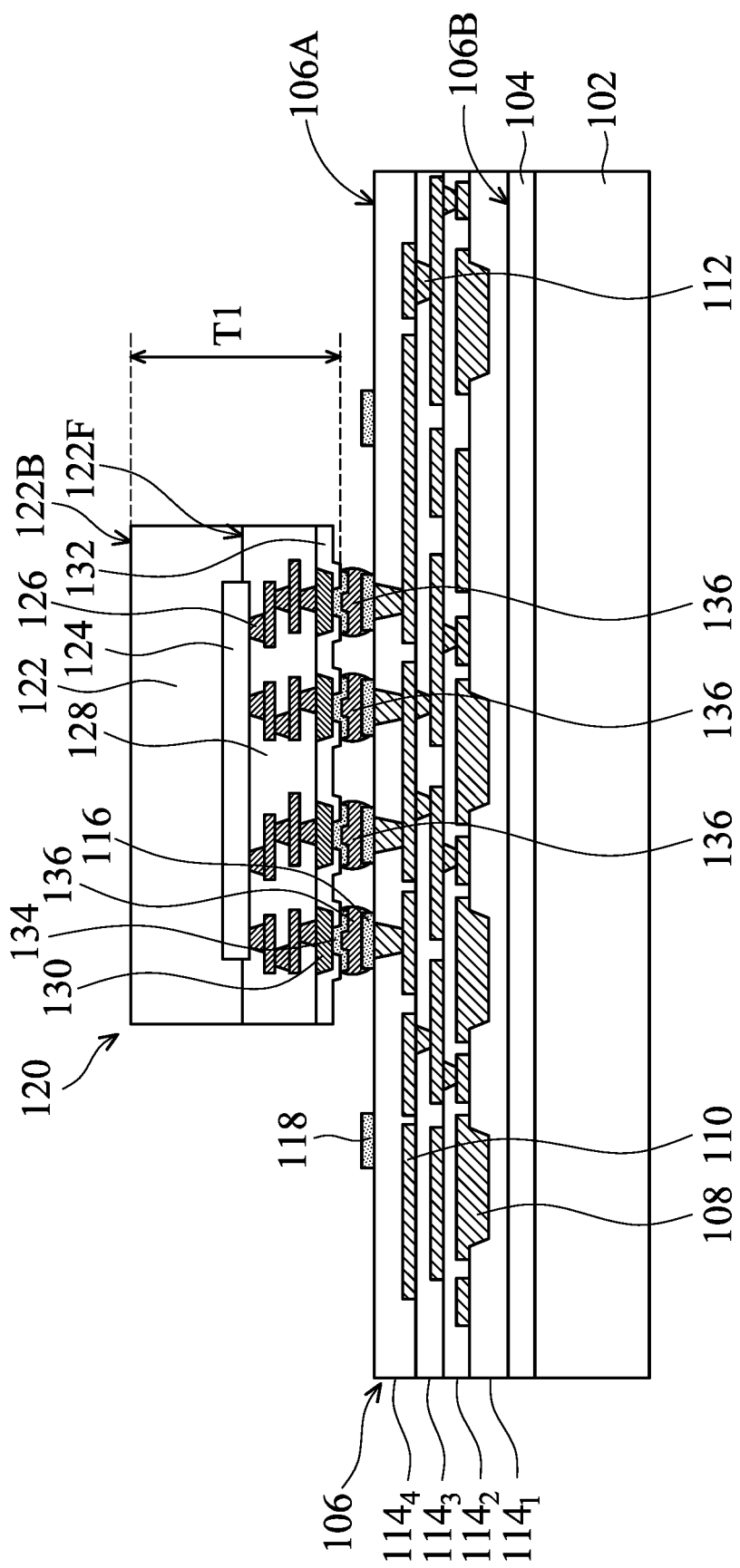

A semiconductor die 120 is disposed over the top surface 106A of the redistribution structure 106, as shown in FIG. 1C, in accordance with some embodiments. The semiconductor die 120 is disposed within the fan-in area 1061 (FIG. 1B-1) of the redistribution structure 106, in accordance with some embodiments. The semiconductor die 120 is bonded to conductive features 112 through the bonding elements 136 and the conductive features 116, in accordance with some embodiments.

The semiconductor die 120 may include application processors, power management integrated circuits, logic devices, memory devices (e.g., static random access memories, SRAMs), radio frequency (RF) devices, input/output (I/O) devices, system-on-chip (SoC) devices, one or more other suitable circuits, or a combination thereof.

In some embodiments, the semiconductor die 120 includes a semiconductor substrate 122 having a backside surface 122B and a front surface 122F. In some embodiments, the semiconductor die 120 also includes an integrated circuit 124 formed in and/or on the front surface 122F of the semiconductor substrate 122. In some embodiments, the semiconductor die 120 also includes an interconnect structure 126 surrounded by an intermetal (IMD) dielectric layer 128 and electrically coupled to the integrated circuit 124. In some embodiments, the semiconductor die 120 also includes conductive pads 130 formed over and electrically coupled to the interconnect structure 126. In some embodiments, the semiconductor die 120 also includes a passivation layer 132 partially covering the conductive pads 130 and UBMs 134 passing through the passivation layer 132 and formed on the conductive pads 130. In some embodiments, the semiconductor die 120 has a thickness T1 in a range from about 150 microns (μm) to 700 μm.

The UBMs 134 of the semiconductor die 120 are bonded to the conductive features 116 over the redistribution structure 106 such as by flip-chip bonding (e.g., by using the bonding elements 136), in accordance with some embodiments. In some embodiments, a thermal reflow operation is carried out. In some embodiments, the bonding elements 136 correspond to and connect the UBMs 134 of the semiconductor die 120 and the conductive features 116. As such, the integrated circuit 124 is electrically coupled to conductive features 108, 110 and 112 of the redistribution structure 106, in accordance with some embodiments.

In some embodiments, the bonding elements 136 are solder joints, microbumps, solder bumps, solder balls, ball grid array (BGA) balls, controlled collapse chip connection (C4) bumps, another suitable bonding elements, and/or a combination thereof. In some embodiments, the bonding elements 136 are tin-containing solder bumps or solder balls. The tin-containing solder bumps or balls may include copper, silver, gold, aluminum, lead, one or more other suitable materials, or a combination thereof. In some embodiments, the bonding elements 136 are lead-free.

Figure 1D:
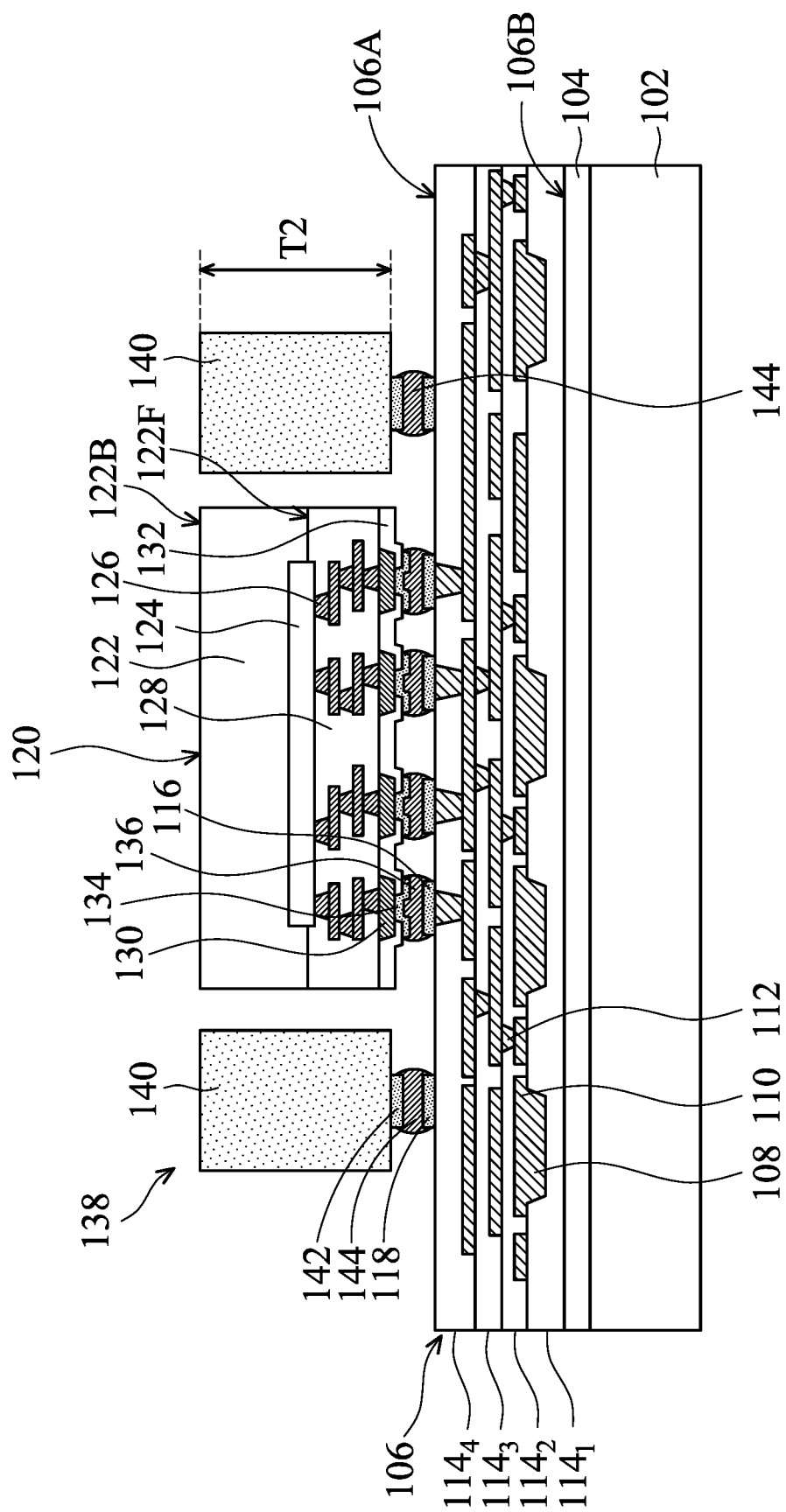
Figures 1, 1D:
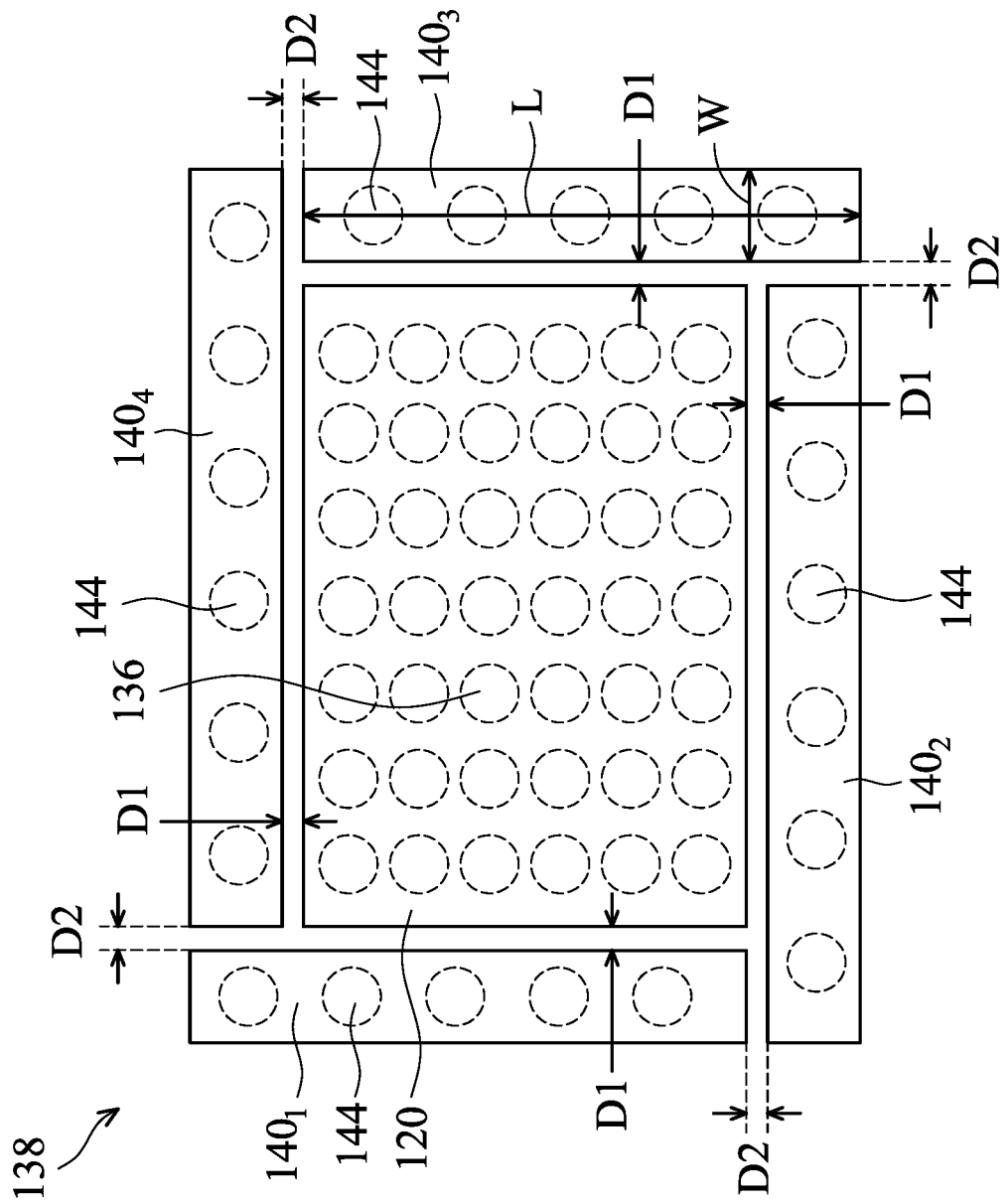

A wall structure 138 is disposed over the top surface 106A of the redistribution structure 106, as shown in FIG. 1D, in accordance with some embodiments. The wall structure 138 is disposed within the fan-out area 1060 (FIG. 1B-1) of the redistribution structure 106, in accordance with some embodiments. The wall structure 138 is bonded to the conductive features 118 through the bonding elements 144, in accordance with some embodiments.

The wall structure 138 includes a plurality of partitions 140 laterally surrounding the semiconductor die 120 and UBMs 142 formed on the partitions 140, in accordance with some embodiments. In some embodiments, the wall structure 138 is segmented and configured as a stress barrier feature which may reduce and/or mitigate stress applied to a subsequently formed underfill material, thereby reducing the risk of cracking of a molding compound and the underfill material.

In some embodiments, the partitions 140 of the wall structure 138 are made of semiconductor material such as silicon. In some embodiments, each of the partitions 140 is a single silicon die without a device or circuit therein. In some embodiments, the partitions 140 of the wall structure 138 are made of ceramic material having high hardness and low coefficient of thermal expansion. For example, the ceramic material may be $Al_2O_3$, $Zr_2O_3$, $SiO_2$, $TiO_2$, MgO, CaO, another suitable ceramic material, and/or a combination thereof. In some embodiments, the partitions 140 of the wall structure 138 have a thickness T2 in a range from about 100 μm to 700 μm.

The UBMs 142 of the wall structure 138 are bonded to the conductive features 118 over the redistribution structure 106 such as by using the bonding elements 144, in accordance with some embodiments. In some embodiments, a thermal reflow operation is carried out. In some embodiments, the bonding elements 144 correspond to and connect the UBMs 142 of the wall structure 138 and the conductive features 118. In some embodiments, the wall structure 138 is not electrically coupled to the conductive features of redistribution structure 106.

In some embodiments, the bonding elements 144 are solder joints, microbumps, solder bumps, solder balls, ball grid array (BGA) balls, controlled collapse chip connection (C4) bumps, another suitable bonding elements, and/or a combination thereof. In some embodiments, the bonding elements 144 are tin-containing solder bumps or solder balls. The tin-containing solder bumps or balls may include copper, silver, gold, aluminum, lead, one or more other suitable materials, or a combination thereof. In some embodiments, the bonding elements 144 are lead-free.

FIG. 1D-1 is a plan view illustrating bonding elements 136 and 144, a semiconductor die 120 and a wall structure 138, in accordance with some embodiments of the disclosure. The wall structure 138 includes four partitions $140_1$, $140_2$, $140_3$ and $140_4$ which are separated from one another and separated from the semiconductor die 120, as shown in FIG. 1D-1, in accordance with some embodiments.

The partitions $140_1$, $140_2$, $140_3$ and $140_4$ laterally surround the semiconductor die 120, in accordance with some embodiments. The partitions $140_1$, $140_2$, $140_3$ and $140_4$ are laterally arranged in a discontinuous ring in the plan view and the semiconductor die 120 is disposed within the discontinuous ring, in accordance with some embodiments. In some embodiments, the discontinuous ring has a rectangular-shaped profile with each side consisted of one partition 140. The partitions $140_1$, $140_2$, $140_3$ and $140_4$ are laterally arranged along the outer contour of the semiconductor die 120 in the plan view, in accordance with some embodiments.

In some embodiments, the semiconductor die 120 have a rectangular-shaped profile. In some embodiments, the dimension (e.g., length or width) of the semiconductor die 120 is in a range from about 10 mm to about 30 mm. In some embodiments, each side of the semiconductor die 120 corresponds to or faces one partition 140.

In some embodiments, the length direction of the partition 140 is disposed in substantially parallel to an extending direction of the corresponding side of the semiconductor die 120. In some embodiments, each of the partitions $140_1$, $140_2$, $140_3$ and $140_4$ has a length L in a range from about 1 mm to about 20 mm. If the length L is greater than 20 mm, the wall structure 138 may not effectively mitigate the stress applied to a subsequently formed underfill material, thereby increasing the risk of cracking of a subsequently formed underfill material.

In some embodiments, the length L of the each of the partitions $140_1$, $140_2$, $140_3$ and $140_4$ is greater than the dimension (e.g., length or width) of the corresponding side of the semiconductor die 120. In alternative embodiments, the length L of partitions 140 is less than the dimension of the semiconductor die 120

In some embodiments, each of the partitions $140_1$, $140_2$, $140_3$ and $140_4$ has a width W in a range from about 1 mm to about 5 mm. In some embodiments, the ratio of the width W to the length L is in a range from about 0.05 to about 1, such as about 0.05 to about 0.25, about 0.25 to about 1, or about 0.25 to about 0.5. If the width W is greater than 5 mm, the wall structure 138 may not effectively mitigate the stress applied to a subsequently formed underfill material, thereby increasing the risk of cracking of a subsequently formed underfill material.

In some embodiments, the width W of each of the partitions $140_1$, $140_2$, $140_3$ and $140_4$ is less than the dimension (e.g., length or width) of the semiconductor die 120. For example, the ratio of the width of the semiconductor die 120 to the width W of the partition 140 is greater than about 2 such as greater than about 3, or greater than about 4.

In some embodiments, each of the partitions $140_1$, $140_2$, $140_3$ and $140_4$ is separated from the semiconductor die 120 by a first distance D1 in a range from about 40 μm to about 200 μm. In some embodiments, the ratio of the width W of the partitions $140_1$, $140_2$, $140_3$ and $140_4$ to the first distance D1 is in a range from about 5 to about 125.

If the first distance D1 is greater than 200 μm, the wall structure 138 may not effectively reduce or mitigate the stress applied to a subsequently formed underfill material, thereby increasing the risk of cracking of a subsequently formed underfill material. If the first distance D1 is less than 40 μm, it may increase the difficulty of the process for disposing the wall structure 138. For example, the wall structure 138 may touch the semiconductor die 120.

In some embodiments, each of the partitions $140_1$, $140_2$, $140_3$ and $140_4$ is separated from one another by a second distance D2 in a range from about 40 μm to about 200 μm. In some embodiments, the ratio of the width W of the partitions $140_1$, $140_2$, $140_3$ and $140_4$ to the second distance D2 is in a range from about 5 to about 125.

If the second distance D2 is greater than 200 μm, the wall structure 138 may not effectively reduce or mitigate the stress applied to a subsequently formed underfill material, thereby increasing the risk of cracking of a subsequently formed underfill material. If the second distance D2 is less than 40 μm, the difficulty of the process for disposing the wall structure 138 may be increased. For example, adjacent partitions 140 may touch one another.

Figure 1E:
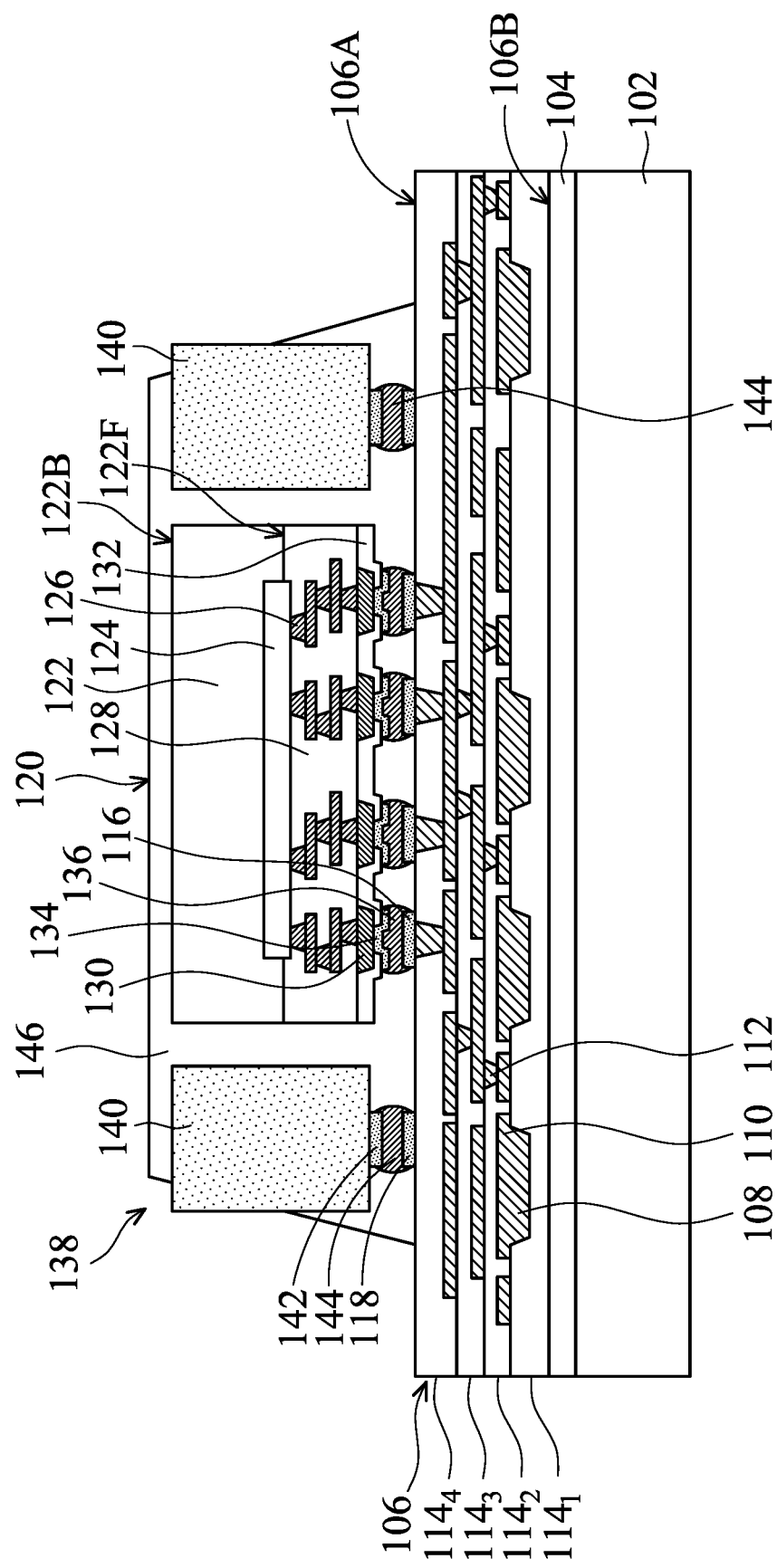

An underfill material 146 is formed over the top surface 106A of the redistribution structure 106, thereby encapsulating the semiconductor die 120, the wall structure 138, the bonding elements 136 and 144, and the conductive features 116 and 118, as shown in FIG. 1E, in accordance with some embodiments. The underfill material 146 fills the spacing between the semiconductor die 120 and the wall structure 138, in accordance with some embodiments. In some embodiments, the underfill material 146 covers lower portions of the sidewalls of the partitions 140 facing away from the semiconductor die 120 while exposing upper portions of the sidewalls of the partitions 140 facing away from the semiconductor die 120, in accordance with some embodiments.

In some embodiments, the underfill material 146 is an electrically insulated adhesive for protecting the bonding elements 136 and 144 and the conductive features 116 and 118 and/or securing the semiconductor die 120 and the wall structure 138. In some embodiments, the underfill material 146 is made of epoxy, resin, epoxy molding compounds, another suitable underfill material, and/or a combination thereof.

Figure 1F:
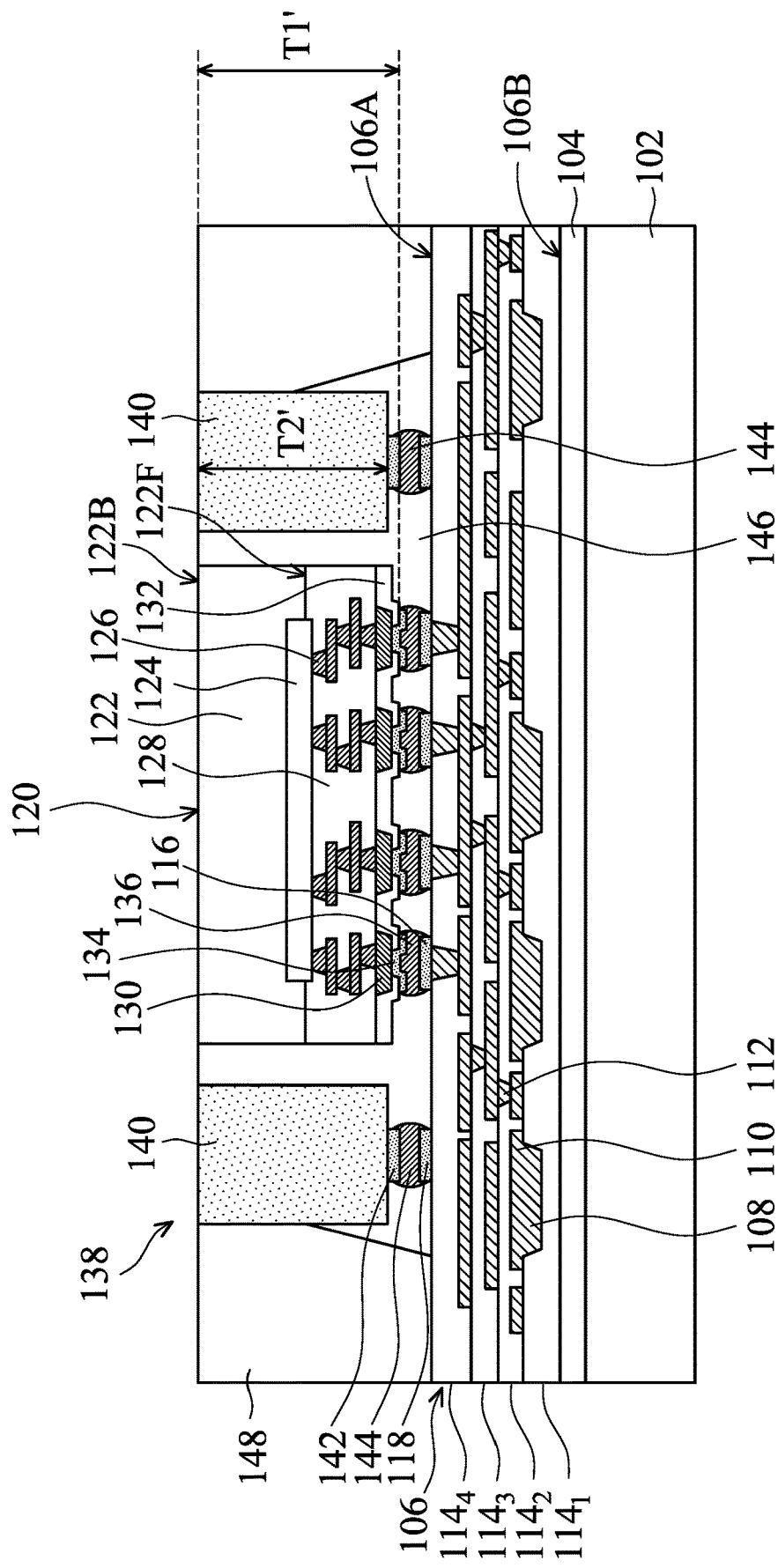

A molding compound 148 is formed over the top surface 106A of the redistribution structure 106, thereby encapsulating the underfill material 146 and the wall structure 138, as shown in FIG. 1F, in accordance with some embodiments. In some embodiments, the molding compound 148 is a single-layer film or a composite stack. In some embodiments, molding compound 148 includes various materials, such as molding underfill, epoxy, resin, or the like. In some embodiments, the molding compound 148 has high thermal conductivity, low moisture absorption rate and high flexural strength.

The molding compound 148 and the underfill material 146 are then planarized until the semiconductor die 120 and the wall structure 138 are exposed, as shown in FIG. 1F, in accordance with some embodiments. The planarization processes may include a mechanical grinding process, a chemical mechanical polishing (CMP) process, a dry polishing process, one or more other applicable processes, or a combination thereof.

After the planarization process, the backside surface 122B of the semiconductor substrate 122, the upper surfaces of the partitions 140, the upper surface of the underfill material 146, and the upper surface of the molding compound 148 are substantially coplanar, in accordance with some embodiments. In some embodiments, the molding compound 148 covers upper portions of the sidewalls of the partitions 140 facing away from the semiconductor die 120, in accordance with some embodiments.

In some embodiments, after the planarization process, the semiconductor die 120 has a thickness T1' in a range from about 150 μm to 700 μm. In some embodiments, after the planarization process, the partitions 140 of the wall structure 138 have a thickness T2' in a range from about 100 μm to 700 μm. In some embodiments, the thickness T1' is substantially equal to or greater than the thickness T2'.

Figure 1G:
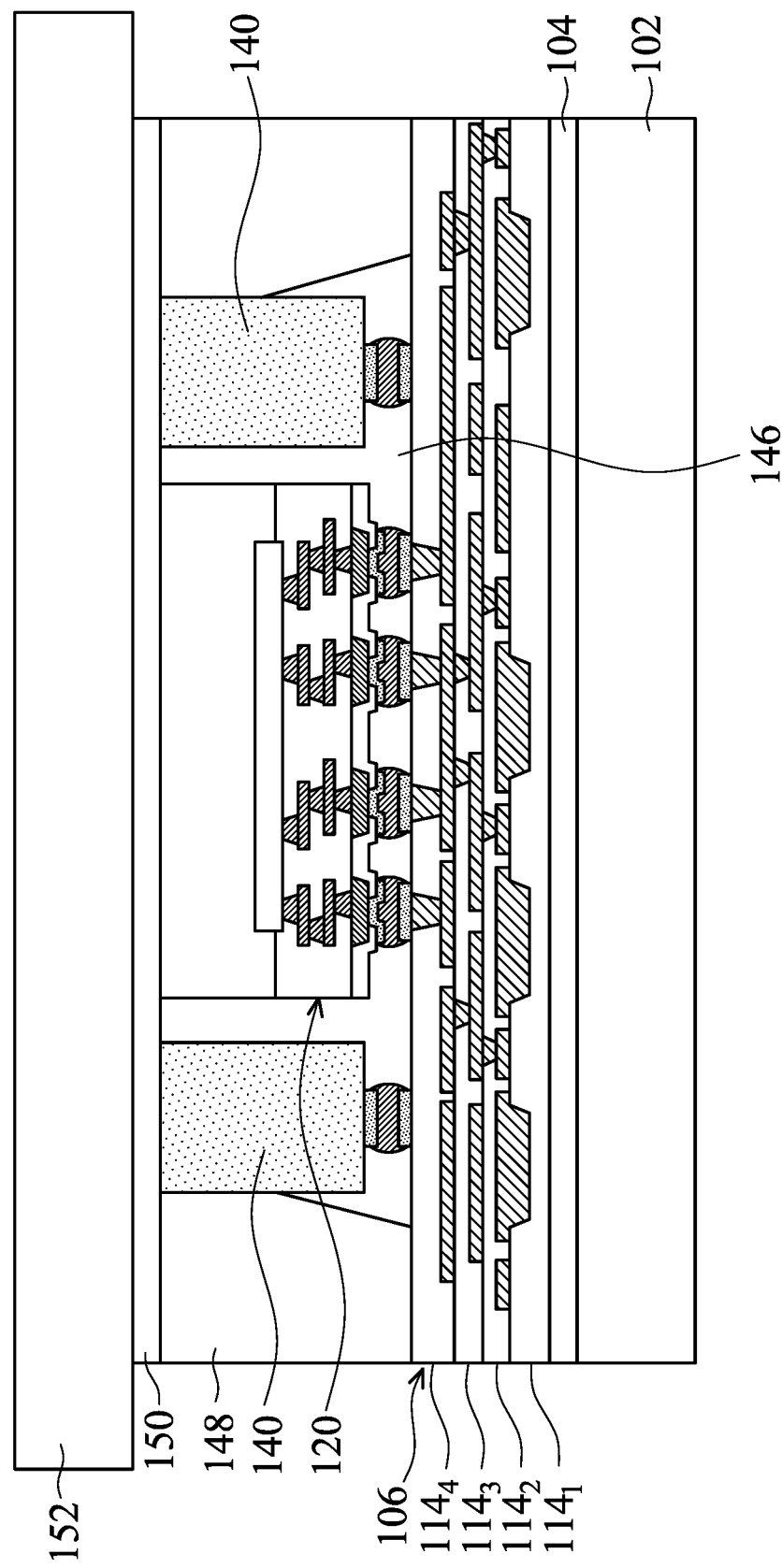

A carrier substrate 152 is attached to the structure of FIG. 1F through an adhesive tape 150, thereby covering the semiconductor substrate 122, the partitions 140, the underfill material 146 and the molding compound 148, as shown in FIG. 1G, in accordance with some embodiments. The carrier substrate 152 is configured to protect the semiconductor substrate 122 and the wall structure 138 from being damaged during following processes, in accordance with some embodiments.

In some embodiments, the carrier substrate 152 is a ceramic substrate, a glass substrate, a polymer substrate, a semiconductor substrate, or another suitable substrate. In some embodiments, the adhesive tape 150 is a release layer that is made of or includes a light-to-heat conversion (LTHC) material. In some embodiments, the adhesive tape 150 is made of a different material than the adhesive tape 104.

Figure 1H:
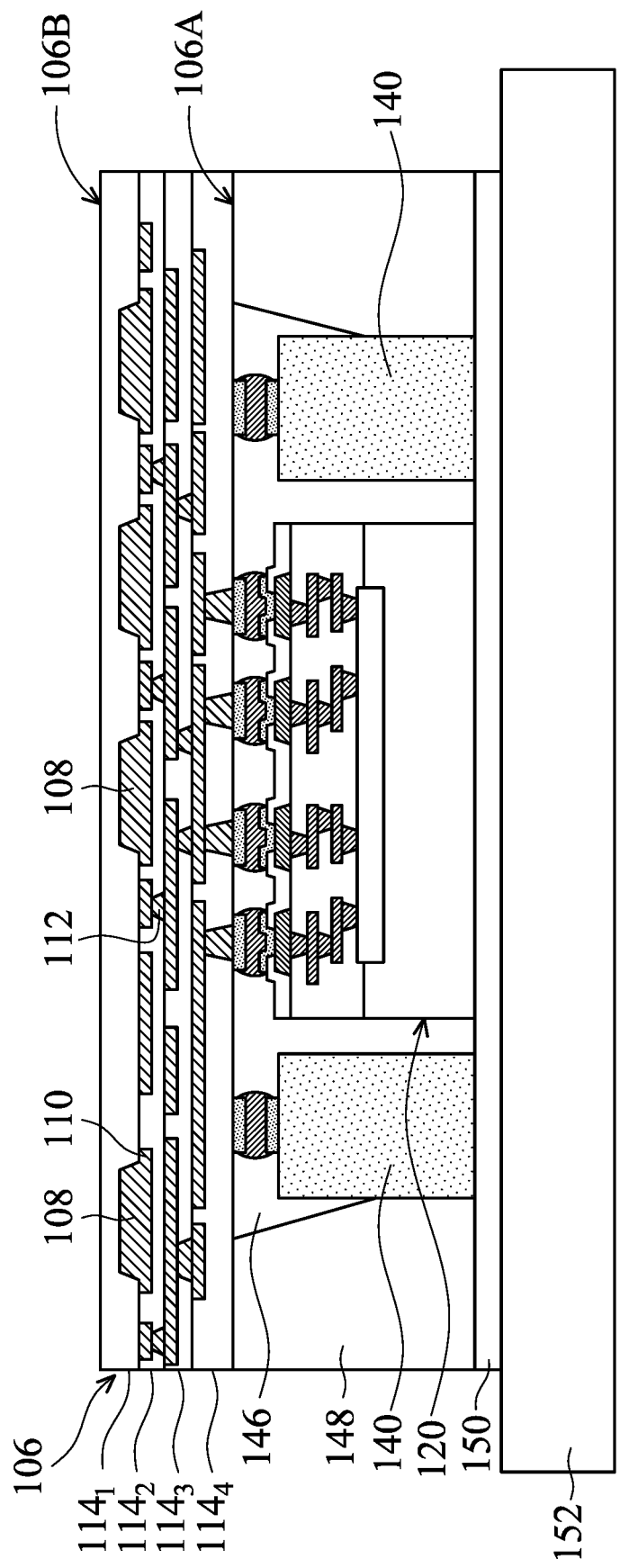

The structure of FIG. 1G is flipped upside down, as shown in FIG. 1H, in accordance with some embodiments. The carrier substrate 102 is then taken away from the redistribution structure 106 by separating the adhesive tape 104 from the carrier substrate 102 and the redistribution structure 106, in accordance with some embodiments. As such, the bottom surface 106B (of the insulating layer $114_1$) of the redistribution structure 106 is exposed, in accordance with some embodiments.

Figure 1I:
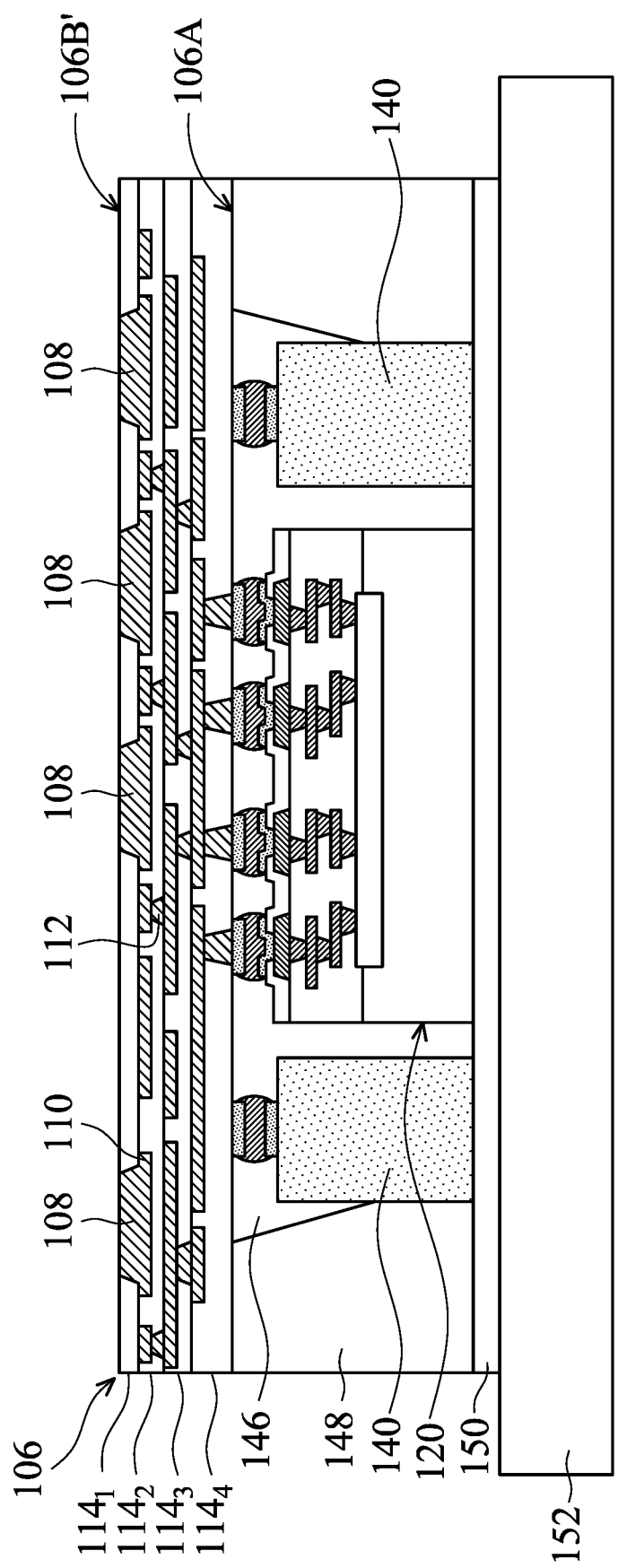

A planarization process is performed on the insulating layer $114_1$ of the redistribution structure 106 until the conductive features 108 are exposed from the insulating layer $114_1$, as shown in FIG. 1I, in accordance with some embodiments. The planarization processes may include a mechanical grinding process, a chemical mechanical polishing (CMP) process, a dry polishing process, one or more other applicable processes, or a combination thereof. After the planarization process, the backside surface of the redistribution structure 106 is denoted as 106B'.

Figure 1J:
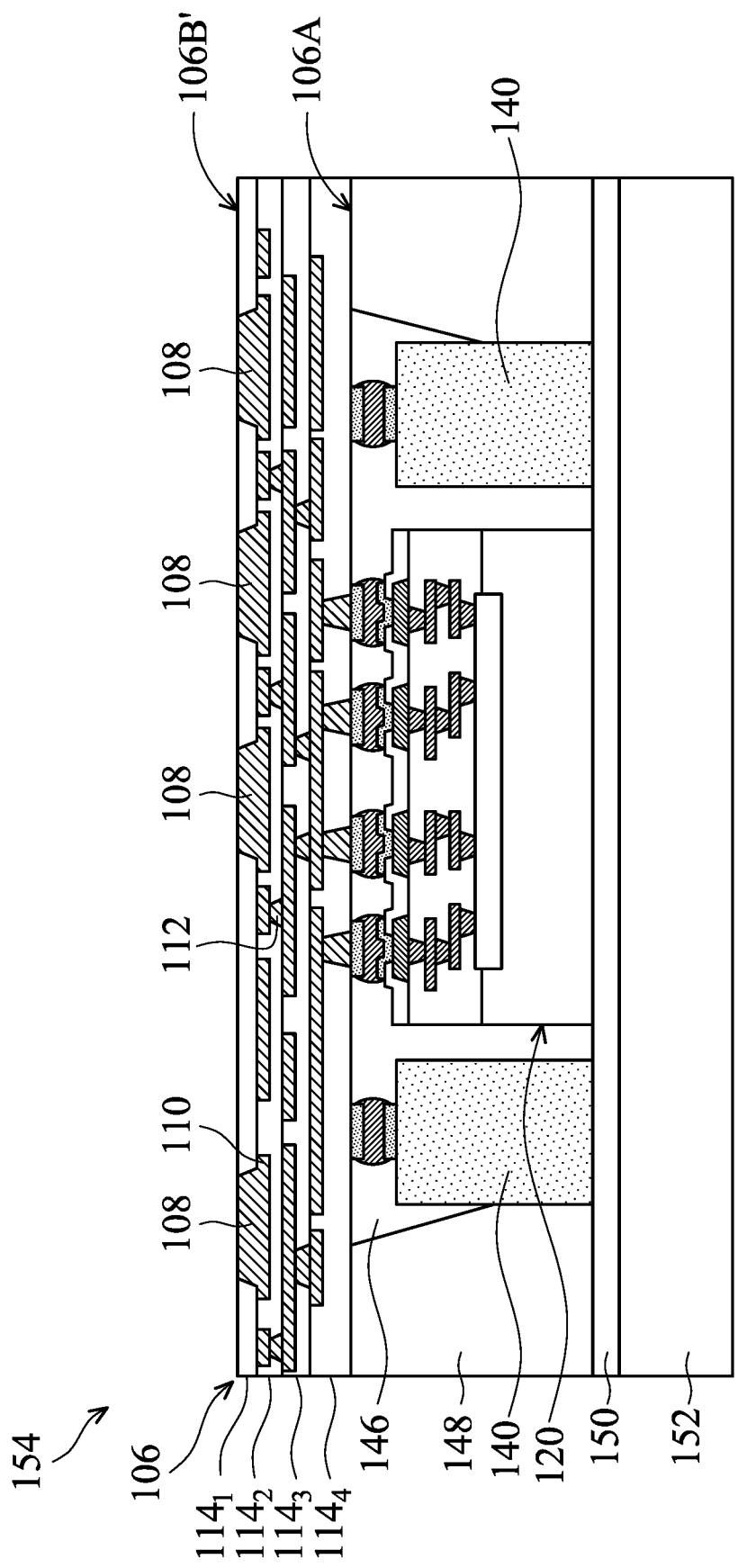

A sawing operation is performed to cut through the structure of FIG. 1I into multiple package structures 154 that are separated from one another, as shown in FIG. 1J, in accordance with some embodiments. FIG. 1J shows the cross-sectional view of one of the obtained package structures 154.

Figure 1K:
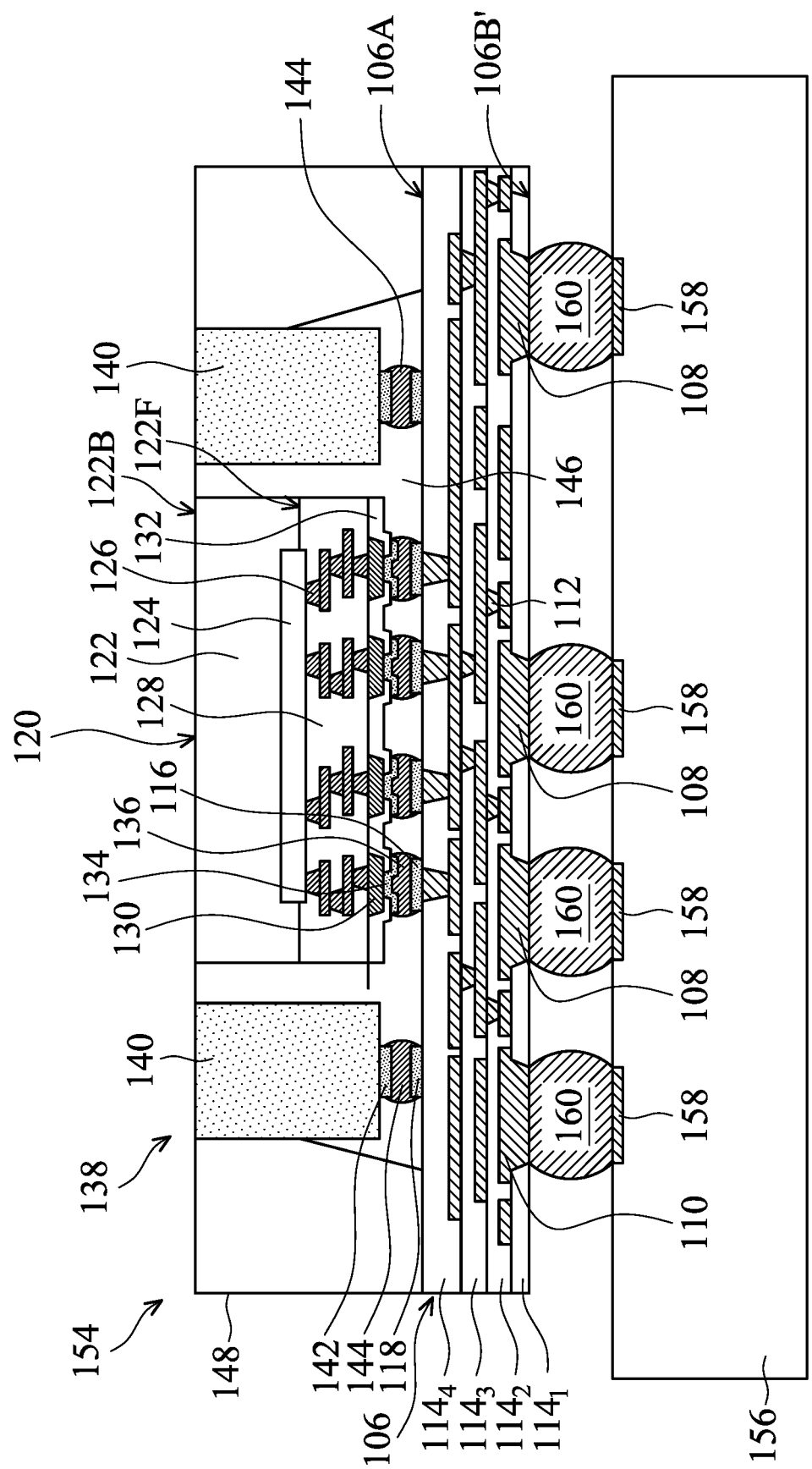

The carrier substrate 152 is taken away from the package structure 154 by separating the adhesive tape 150 from the carrier substrate 152 and a package structure 154, in accordance with some embodiments. The package structure 154 is disposed over and bonded to a substrate 156 through the bonding elements 160, as shown in FIG. 1K, in accordance with some embodiments. In some embodiments, the bottom surface 106B' of the redistribution structure 106 is bonded to the upper surface of the substrate 156.

In some embodiments, the substrate 156 is a printed circuit board (PCB). In alternative embodiments, the substrate 156 is an interposer substrate that may then be bonded to another substrate. In some embodiments, the substrate 156 is fabricated with a predetermined functional circuit thereon. For example, the functional circuit may include conductive pad, conductive lines, conductive traces, conductive vias and/or active circuitry components such as transistor, diode, and the like. In some embodiments, the substrate 156 includes conductive pads 158 exposed from and/or protruding from the upper surface of the substrate 156.

In some embodiments, the bonding elements 160 are solder joints, controlled collapse chip connection (C4) bumps, solder bumps, solder balls, ball grid array (BGA) balls, another suitable bonding elements, and/or a combination thereof. In some embodiments, the bonding elements 160 are tin-containing solder bumps or solder balls. The tin-containing solder bumps or balls may include copper, silver, gold, aluminum, lead, one or more other suitable materials, or a combination thereof. In some embodiments, the bonding elements 160 are lead-free.

The conductive features 108 of the redistribution structure 106 are bonded to the conductive pads 158 of the substrate 156 through using the bonding elements 160, in accordance with some embodiments. In some embodiments, a thermal reflow operation is carried out. In some embodiments, the bonding elements 160 correspond to and connect the conductive features 108 of the redistribution structure 106 and the conductive pads 158 of the substrate 156. As such, the integrated circuit 124 of the semiconductor die 120 is electrically coupled to the substrate 156, in accordance with some embodiments. The wall structure 138 is electrically insulated from the functional circuit of the substrate 156, in accordance with some embodiments.

Figure 1L:
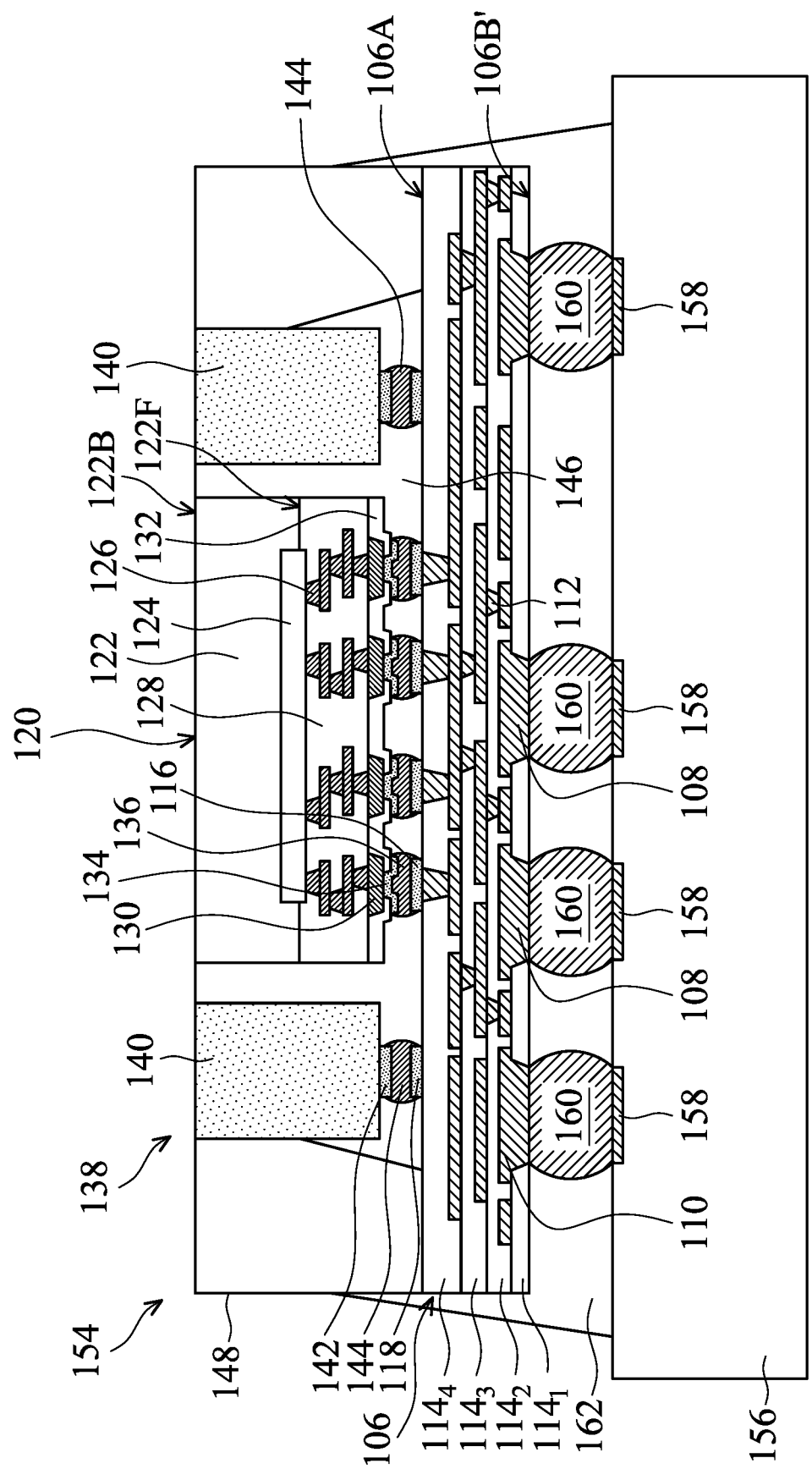

An underfill material 162 is formed over the upper surface of the substrate 156 and encapsulates the package structure 154 and the bonding elements 160, as shown in FIG. 1L, in accordance with some embodiments. The underfill material 162 fills the spacing between the package structure 154 and the substrate 156, in accordance with some embodiments. The underfill material 162 covers the sidewalls of the molding compound 148 and the sidewalls of the redistribution structure 106, in accordance with some embodiments.

In some embodiments, the underfill material 162 is an electrically insulated adhesive for protecting the bonding elements 160 and/or securing the package structure 154. In some embodiments, the underfill material 162 is made of epoxy, resin, epoxy molding compounds, another suitable underfill material, and/or a combination thereof.

A large difference of coefficients of thermal expansion (CTE) may exist between the substrate 156 and the semiconductor die 120. During reliability tests, operations of the package structure and/or thermal processes, the bonding elements 136 may induce a large tensile stress applied to the underfill material 146 at the corners and the sides of the semiconductor die 120. The large tensile stress may cause cracks to be formed within the underfill material 146 from the corners and the sides of the semiconductor die 120. The cracks may propagate into the molding compound 148.

In accordance with the embodiments of the present disclosure, the package structure includes a wall structure 138 which includes a plurality of partitions 140. The plurality of partitions 140 are separated from one another and from the semiconductor die 120 and laterally surrounding the semiconductor die 120. The wall structure 138 may reduce or mitigate the tensile stress induced by the bonding elements 136 and applied to the underfill material 146, thereby reducing the risk of cracking of the molding compound 148 and the underfill material 146. As a result, the performance and reliability of the package structure may be improved.

Figure 2:
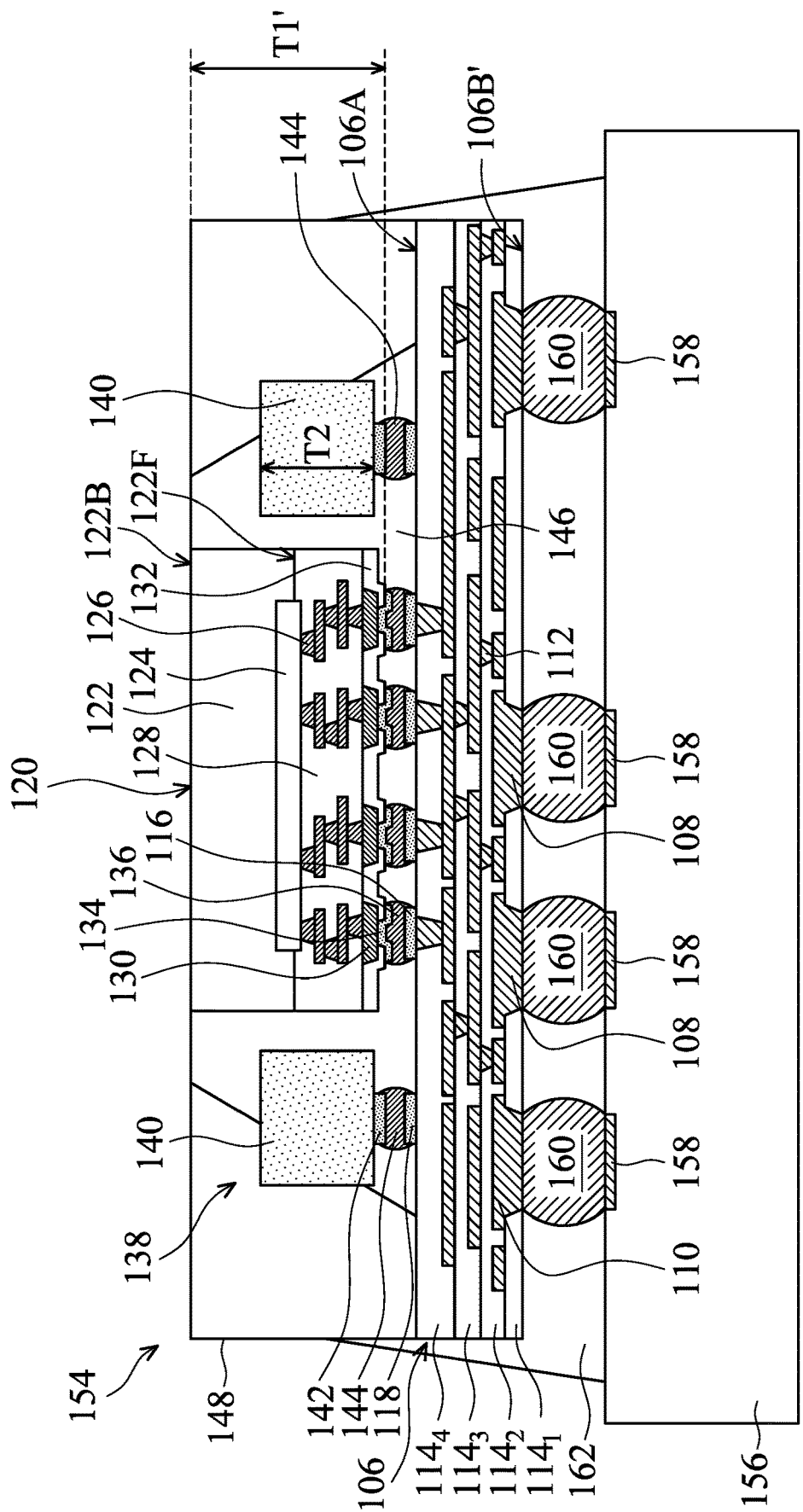
FIG. 2 is a modification of the cross-sectional view of FIG. 1L, in accordance with some embodiments of the disclosure.

FIG. 2 is a modification of the cross-sectional view of FIG. 1L, in accordance with some embodiments of the disclosure. The package structure of FIG. 2 is similar to the package structure of FIG. 1L, except for the partitions 140 of the wall structure 138 covered by the molding compound 148 and the underfill material 146, in accordance with some embodiments.

In some embodiments, the thickness T2 of the partitions 140 of the wall structure 138 is less than the thickness T1 of the semiconductor die 120. After the planarization described above with respect to FIG. 1F, the backside surface 122B of the semiconductor substrate 122 is exposed while the upper surfaces of the partitions 140 are covered by the molding compound 148 and underfill material 146, as shown FIG. 2, in accordance with some embodiments.

In some embodiments, the ratio of the thickness T2 of the partitions 140 to thickness T1' of the semiconductor die 120 is greater than about 0.5 and less than about 1. If the ratio of the thickness T2 to thickness T1' is less than 0.5, the wall structure 138 may not effectively reduce or mitigate the tensile stress applied to the underfill material 146.

Figure 3:
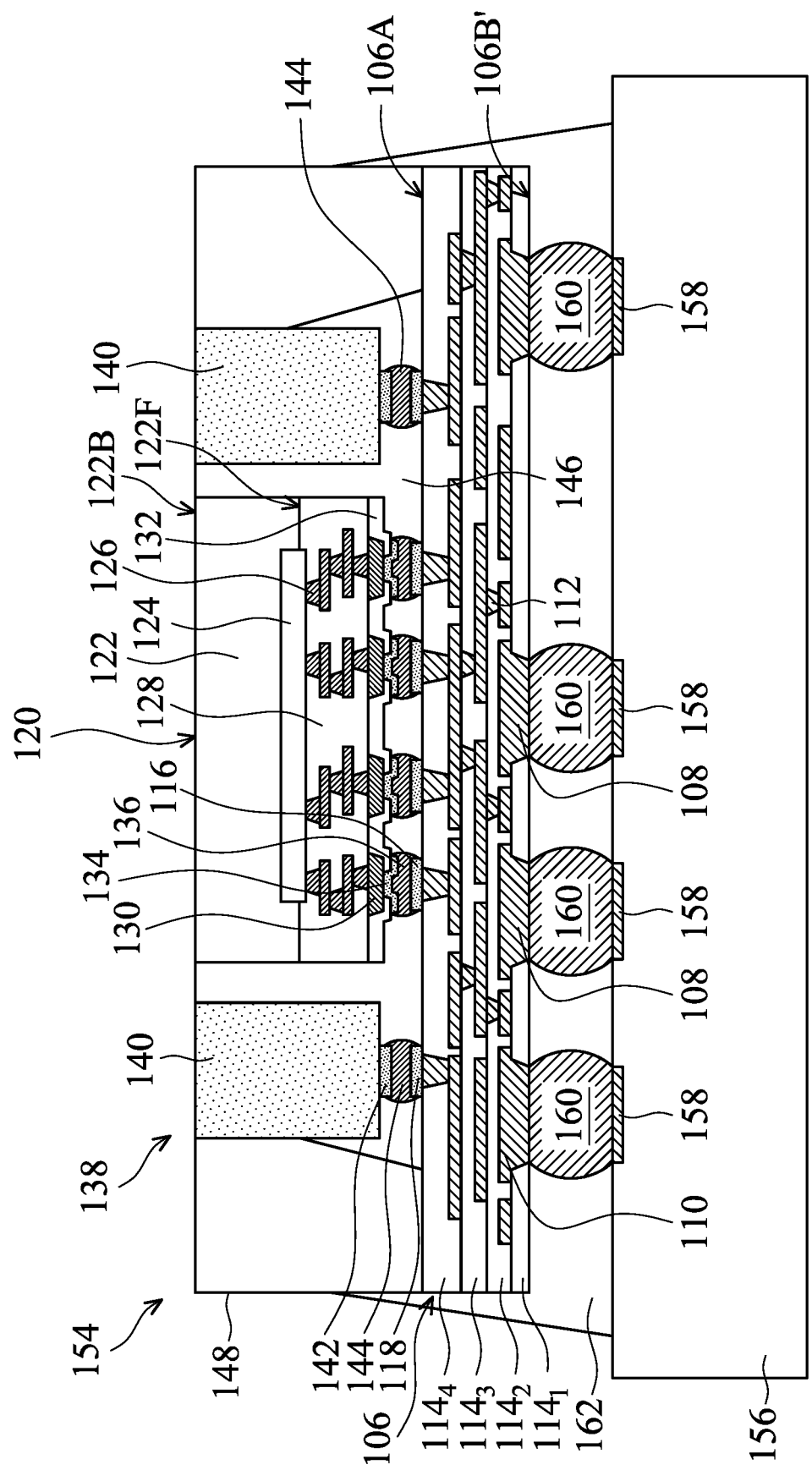
FIG. 3 is a modification of the cross-sectional view of FIG. 1L, in accordance with some embodiments of the disclosure.

FIG. 3 is a modification of the cross-sectional view of FIG. 1L, in accordance with some embodiments of the disclosure. The package structure of FIG. 3 is similar to the package structure of FIG. 1L, except that the partitions 140 are connected to the conductive features 112 in the insulating layer $114_4$, in accordance with some embodiments.

The conductive features 118 along with conductive features 116 are formed on and in contact with some of the conductive features 112 in the insulating layer $114_4$, in accordance with some embodiments. The UBMs 142 of the wall structure 138 are bonded to the conductive features 118 by using the bonding elements 144, in accordance with some embodiments. In some embodiments, the wall structure 138 is connected to the conductive features 112 in the insulating layer $114_4$ through the bonding elements 144 and the conductive features 118.

In some embodiments, the conductive features 112 in contact with the conductive features 118 are not electrically connected to the conductive features 110 in the insulating layer $114_3$, in accordance with some embodiments. As a result, the wall structure 138 is electrically insulated from the substrate 156, in accordance with some embodiments.

Figure 4:
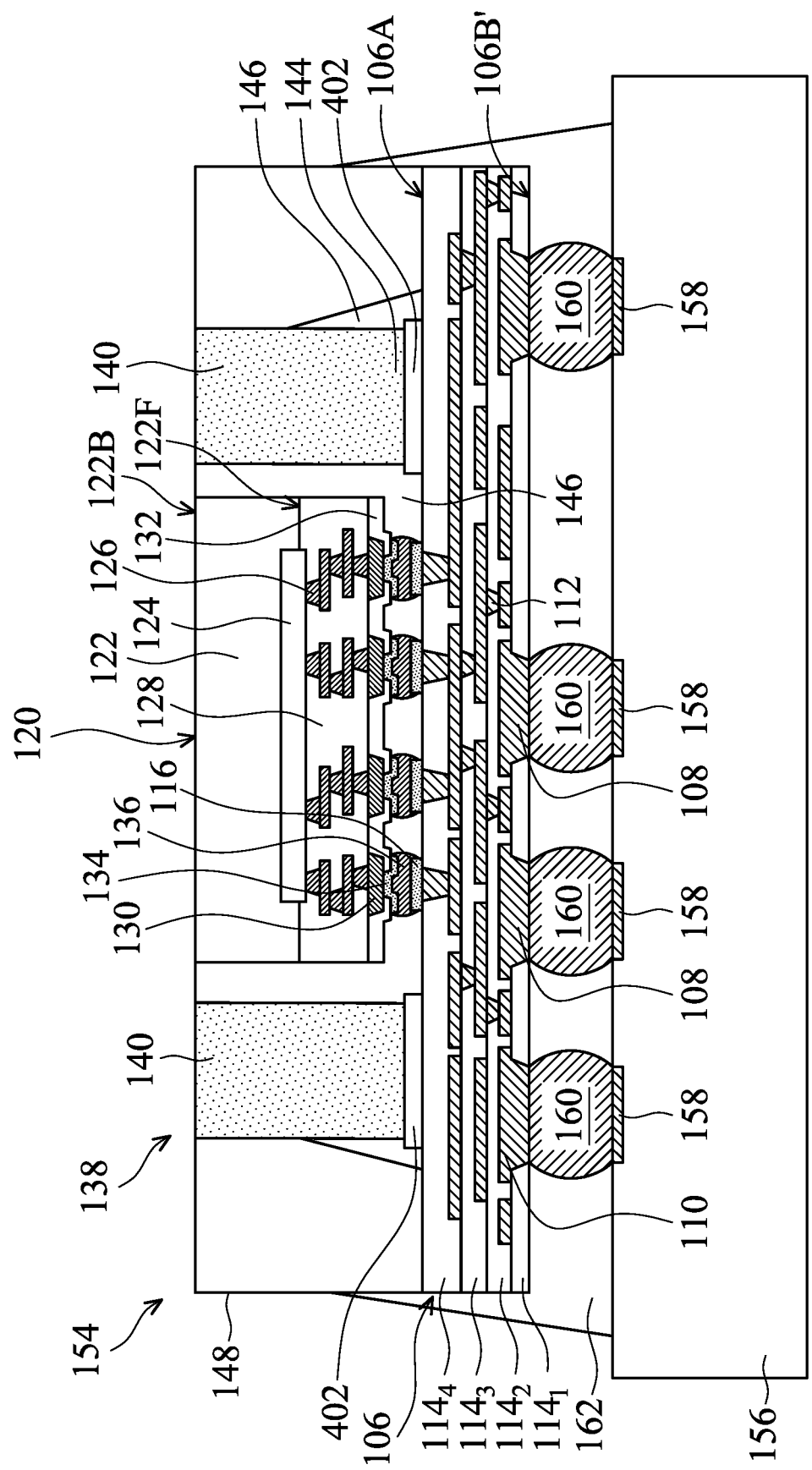
FIG. 4 is a modification of the cross-sectional view of FIG. 1L, in accordance with some embodiments of the disclosure.

FIG. 4 is a modification of the cross-sectional view of FIG. 1L, in accordance with some embodiments of the disclosure. The package structure of FIG. 4 is similar to the package structure of FIG. 1L, except that the partitions 140 of the wall structure 138 are bond to the redistribution structure 106 through the bonding elements 402, in accordance with some embodiments.

The wall structure 138 is bonded to and/or attached to the top surface 106A (of the insulating layer $114_4$) of the redistribution structure 106 through the bonding elements 402, in accordance with some embodiments. In some embodiments, the bonding elements 402 are adhesive tapes. The bonding elements 402 may be made of epoxy, resin, epoxy molding compounds, another suitable underfill material, and/or a combination thereof.

Figure 5:
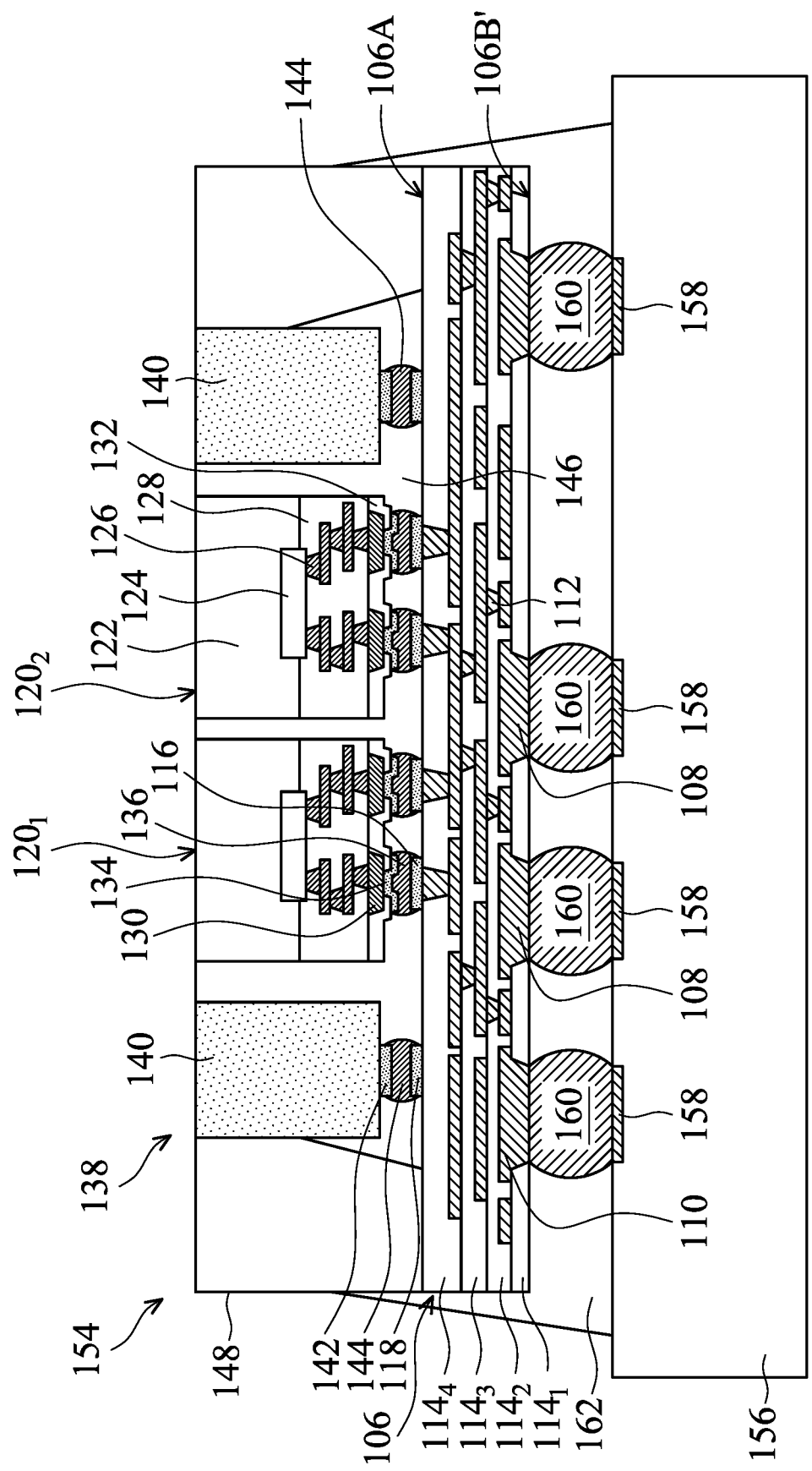
FIG. 5 is a modification of the cross-sectional view of FIG. 1L, in accordance with some embodiments of the disclosure.
Figures 1, 5:
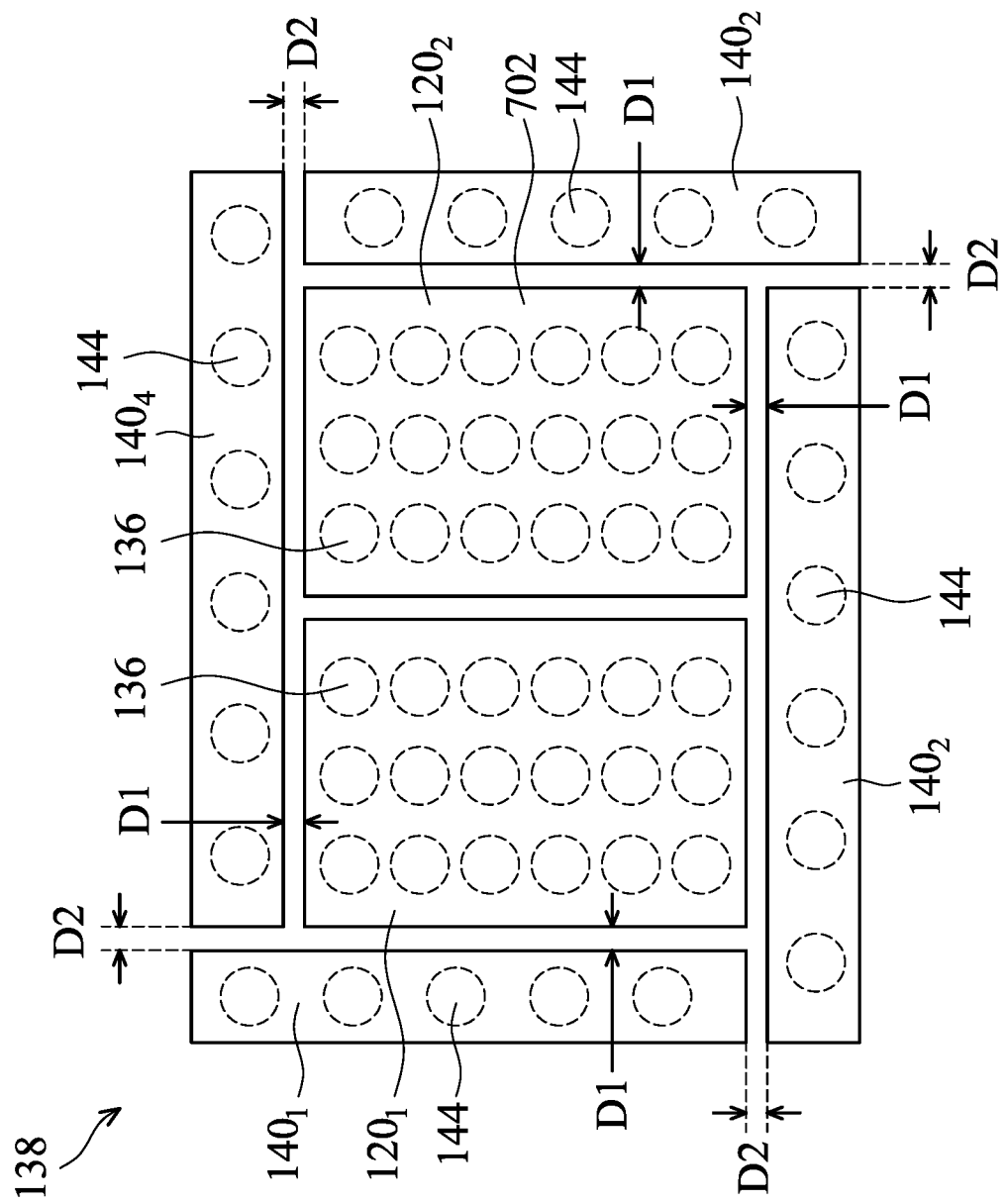

FIG. 5 is a modification of the cross-sectional view of FIG. 1L, in accordance with some embodiments of the disclosure. The package structure of FIG. 5 is similar to the package structure of FIG. 1L, except for the package structure of FIG. 5 including two semiconductor dies 120, in accordance with some embodiments.

Two semiconductor dies $120_1$ and $120_2$ are disposed over the top surface 106A of the redistribution structure 106, as shown in FIG. 5, in accordance with some embodiments. The semiconductor dies $120_1$ and $120_2$ are similar as the semiconductor dies 120 described with respect to FIG. 1C, in accordance with some embodiments.

The semiconductor die $120_1$ and $120_2$ are disposed within the fan-in area 1061 (FIG. 1B-1) of the redistribution structure 106, in accordance with some embodiments. The semiconductor dies $120_1$ and $120_2$ are bonded to the conductive features 116 through the bonding elements 136, in accordance with some embodiments. The integrated circuit 124 of the semiconductor die $120_1$ and the integrated circuit 124 of the semiconductor die $120_2$ are electrically coupled to the substrate 156, in accordance with some embodiments.

FIG. 5-1 is a plan view illustrating bonding elements 136 and 144, semiconductor dies $120_1$ and $120_2$ and a wall structure 138, in accordance with some embodiments of the disclosure. The semiconductor dies $120_1$ and $120_2$ are arranged side by side, as shown in FIG. 5-1, in accordance with some embodiments. The partitions $140_1$, $140_2$, $140_3$ and $140_4$ of the wall structure 138 are separated from one another and separated from the semiconductor dies $120_1$ and $120_2$, in accordance with some embodiments.

The partitions $140_1$, $140_2$, $140_3$ and $140_4$ laterally surround semiconductor dies $120_1$ and $120_2$, in accordance with some embodiments. The partitions $140_1$, $140_2$, $140_3$ and $140_4$ are laterally arranged in a discontinuous ring in the plan view and the semiconductor dies $120_1$ and $120_2$ are disposed within the discontinuous ring, in accordance with some embodiments. The partitions $140_1$, $140_2$, $140_3$ and $140_4$ are laterally arranged along the outer contour of the combination structure of the semiconductor dies $120_1$ and $120_2$ in the plan view, in accordance with some embodiments.

In some embodiments, each of the partitions $140_1$, $140_2$, $140_3$ and $140_4$ is separated from the semiconductor die $120_1$ and/or $120_2$ adjacent thereto by a first distance D1 in a range from about 40 μm to about 200 μm. In some embodiments, the ratio of the width W of the partitions $140_1$, $140_2$, $140_3$ and $140_4$ to the first distance D1 is in a range from about 5 to about 125.

In accordance with the embodiments of the present disclosure, the partitions 140 of the wall structure 138 are laterally separated from one another and from the semiconductor die $120_1$ and $120_2$ and surround the semiconductor dies $120_1$ and $120_2$. The wall structure 138 may reduce or mitigate the tensile stress which is induced by the bonding elements 136 from the corners and the sides of the semiconductor dies $120_1$ and $120_2$, thereby reducing the risk of cracking of the molding compound 148 and the underfill material 146. As a result, the performance and reliability of the package structure may be improved.

FIGS. 6-1, 6-2, 6-3, 6-4, 6-5, 6-6 and 6-7 are plan views illustrating various configurations of semiconductor dies 120 and a wall structure 138, in accordance with some embodiments of the disclosure.

FIG. 6-1 illustrates a similar configuration to that shown in FIG. 5-1, except that the wall structure 138 includes more than four partitions 140. The partitions 140 are laterally arranged in a discontinuous ring in the plan view and the semiconductor dies $120_1$ and $120_2$ are disposed within the discontinuous ring, in accordance with some embodiments. In some embodiments, the discontinuous ring has a rectangular-shaped profile with each side consisted of more than one partitions 140. In some embodiments, some sides of the semiconductor dies $120_1$ and $120_2$ correspond to or face more than one partition 140. In some embodiments, the length L of the partitions 140 is less than a dimension (e.g., length or width) of the corresponding side of the semiconductor die 120.

In some embodiments, each of the partitions 140 are separated from one another by a second distance D2 in a range from about 40 µm to about 200 µm. In some embodiments, each of the partitions 140 is separated from the semiconductor dies $120_1$ or $120_2$ adjacent thereto by a first distance D1 in a range from about 40 µm to about 200 µm.

FIG. 6-2 illustrates a similar configuration to that shown in FIG. 6-1, except that the package structure includes four semiconductor dies $120_1$, $120_2$, $120_3$ and $120_4$ arranged side by side. The partitions 140 of the wall structure 138 are separated from the semiconductor dies $120_1$, $120_2$, $120_3$ and $120_4$, in accordance with some embodiments. The partitions 140 laterally surround semiconductor dies $120_1$, $120_2$, $120_3$ and $120_4$, in accordance with some embodiments. The partitions 140 are laterally arranged along the outer contour of the combination structure of the semiconductor dies $120_1$, $120_2$, $120_3$ and $120_4$ in the plan view, in accordance with some embodiments. In some embodiments, each of the partitions 140 is separated from the semiconductor die $120_1$, $120_2$, $120_3$ and/or $120_4$ adjacent thereto by a first distance D1 in a range from about 40 µm to about 200 µm.

FIG. 6-3 illustrates a similar configuration to that shown FIG. 6-1, except that the partition 140 of the wall structure 138 has a square-shaped profile in the plan view.

FIG. 6-4 illustrates a similar configuration to that shown FIG. 6-1, except that some partitions (denoted as 140L) of the wall structure 138 disposed adjacent to the corners of the semiconductor dies $120_1$ and $120_2$ have L-shaped profile in the plan view.

FIG. 6-5 illustrates a configuration of semiconductor dies and a wall structure. In some embodiments, a partition $140_1$ is disposed along a sidewall B2 of the semiconductor die $120_1$, and a partition $140_2$ is disposed along a sidewall B3 of the semiconductor die $120_2$. In some embodiments, the longitudinal axis of the partition $140_1$ is substantially perpendicular to the longitudinal axis of the partition $140_2$. In some embodiments, a sidewall A1 of the partition $140_1$ is aligned with a sidewall B1 of the semiconductor die $120_2$. In some embodiments, a sidewall A3 of the partition $140_2$ is aligned with a sidewall B2 of the semiconductor die $120_2$. As such, the first distance D1 between the partition $140_1$ and the semiconductor die $120_2$ may be substantially equal to the second distance D2 between the partition $140_1$ and the partition $140_2$. In some embodiments, a sidewall A5 of the partition $140_2$ is aligned with a sidewall B4 of the semiconductor die $120_2$. In addition, in some embodiments, a sidewall A2 of the partition $140_1$ is aligned with a sidewall A4 of the partition $140_2$.

FIG. 6-6 illustrates a configuration of semiconductor dies and a wall structure. In some embodiments, the first distance D1 between the partition $140_2$ and the semiconductor die $120_1$ may be less than the distance D2 between the partition $140_1$ and the partition $140_2$.

Figure 7:
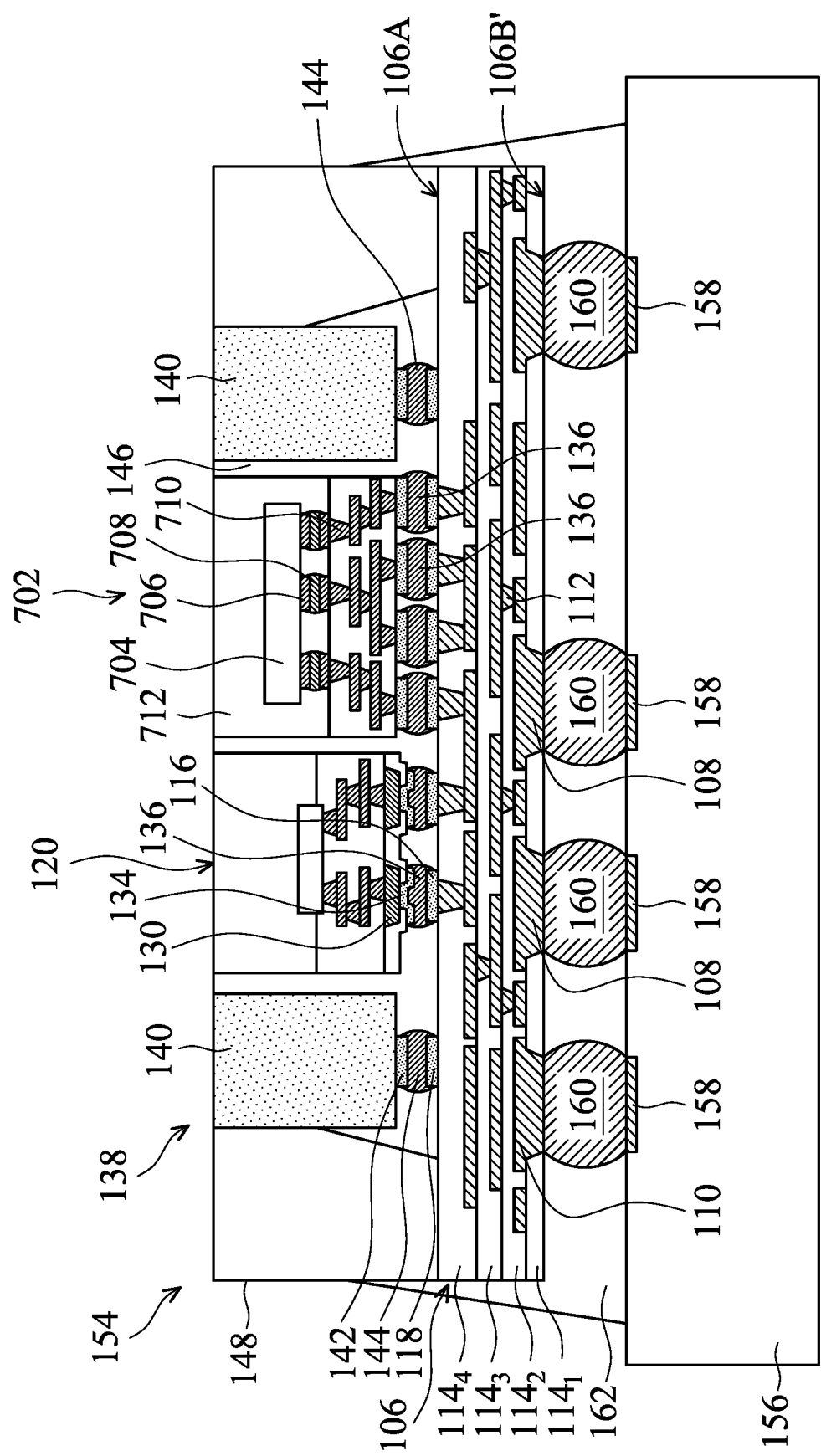
Figures 1, 7:
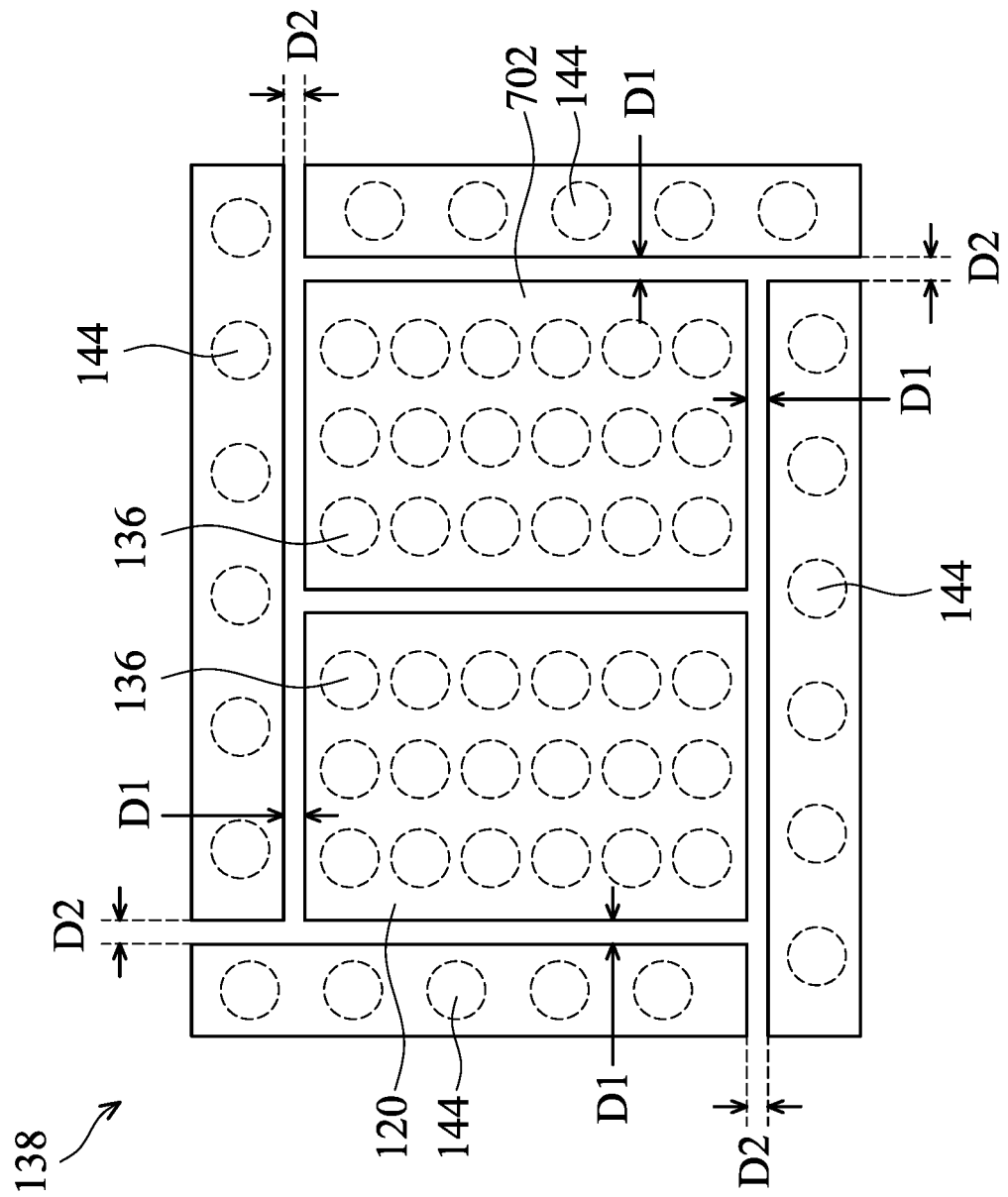

FIG. 6-7 illustrates a configuration of a semiconductor die and a wall structure. In some embodiments, the sidewall A1 of the partition $140_1$ is between the extension lines (denoted by dash lines) of the sidewall A2 and the sidewall A3 of the partition $140_2$.

In accordance with some embodiments of the present disclosure, the flexibility of the process for disposing the wall structure 138 may be increased by adjusting the shapes, the size and the configuration of the partitions 140.

FIG. 7 is a modification of the cross-sectional view of FIG. 1L, in accordance with some embodiments of the disclosure. The package structure of FIG. 7 is similar to the package structure of FIG. 1L, except for the package structure of FIG. 7 further including a package 702, in accordance with some embodiments.

In some embodiments, the package 702 includes a redistribution structure 710, a semiconductor die 704 disposed over the redistribution structure 710, and a molding compound 712 encapsulating the semiconductor die 704. In some embodiments, conductive pads 706 of the semiconductor die 704 are bonded to and electrically coupled to the redistribution structure 710 through the bonding elements 708, e.g., solder joints, solder bumps, solder balls, and/or a combination thereof.

The package components of the package 702 shown in FIG. 7 are merely for the purpose of illustration, and the package 702 may have any applicable package components. In some embodiments, the package 702 is a chip-scale package (CSP), chip on wafer on substrate (CoWoS) package, a system on integrated chip (SoIC) package, and/or a three dimensional integrated circuit (3CIC). In some embodiments, the package 702 includes high bandwidth memory (HBM) device.

In the steps described above with respect to FIG. 1C, the package 702 along with the semiconductor die 120 is disposed over the top surface 106A of the redistribution structure 106, in accordance with some embodiments. The redistribution structure 710 of the package 702 is bonded to and electrically coupled to the conductive features 112 of the redistribution structure 106 through the bonding elements 136 and the conductive features 116, in accordance with some embodiments.

The steps described above with respect to FIGS. 1D through 1L are performed, thereby producing the package structure as shown in FIG. 7, in accordance with some embodiments. The package 702 is electrically coupled to the substrate 156, in accordance with some embodiments.

FIG. 7-1 is a plan view illustrating bonding elements 136 and 144, a semiconductor die 120, a package 702 and a wall structure 138, in accordance with some embodiments of the disclosure. The semiconductor die 120 and the package 702 are arranged side by side, as shown in FIG. 7-1, in accordance with some embodiments. The partitions $140_1$, $140_2$, $140_3$ and $140_4$ of the wall structure 138 are separated from one another and separated from the semiconductor dies 120 and the package 702, in accordance with some embodiments.

The partitions $140_1$, $140_2$, $140_3$ and $140_4$ laterally surround semiconductor dies 120 and the package 702, in accordance with some embodiments. The partitions $140_1$, $140_2$, $140_3$ and $140_4$ are laterally arranged in a discontinuous ring in the plan view and the semiconductor die 120 and the package 702 are disposed within the discontinuous ring, in accordance with some embodiments. The partitions $140_1$, $140_2$, $140_3$ and $140_4$ are laterally arranged along the outer contour of the combination structure of the semiconductor dies 120 and the package 702 in the plan view, in accordance with some embodiments.

In some embodiments, the partitions $140_1$, $140_2$, $140_3$ and $140_4$ are separated from the semiconductor dies 120 and/or the package 702 adjacent thereto by a first distance D1 in a range from about 40 µm to about 200 µm. In some embodiments, the ratio of the width W of the partitions $140_1$, $140_2$, $140_3$ and $140_4$ to the first distance D1 is in a range from about 5 to about 125.

In accordance with the embodiments of the present disclosure, the partitions 140 of the wall structure 138 are laterally separated from one another, from the semiconductor die 120, and from the package 702 and surround the semiconductor die 120 and the package 702. The wall structure 138 may reduce or mitigate the tensile stress which is induced by the bonding elements 136 from the corners and the sides of the semiconductor die 120 and the package 702, thereby reducing the risk of cracking of the molding compound 148 and the underfill material 146. As a result, the performance and reliability of the package structure may be improved.

Figure 8:
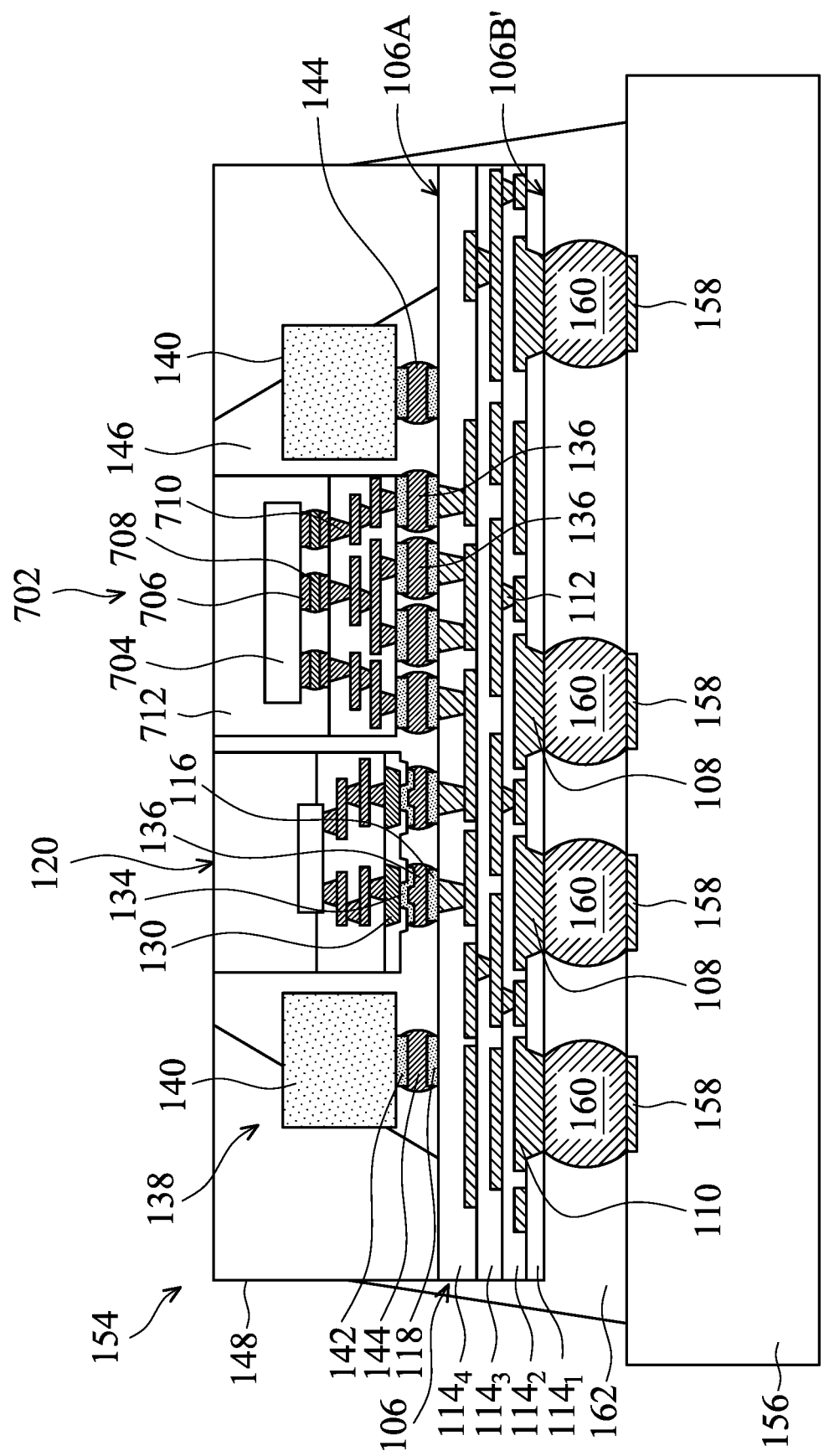
FIG. 8 is a modification of the cross-sectional view of FIG. 7, in accordance with some embodiments of the disclosure.

FIG. 8 is a modification of the cross-sectional view of FIG. 7, in accordance with some embodiments of the disclosure. The package structure of FIG. 8 is similar to the package structure of FIG. 7, except for the partitions 140 of the wall structure 138 covered by the molding compound 148 and the underfill material 146, in accordance with some embodiments.

FIGS. 9-1, 9-2, 9-3, 9-4 and 9-5 are plan views illustrating various configurations of semiconductor dies 120, packages 702 and a wall structure 138, in accordance with some embodiments of the disclosure.

FIG. 9-1 illustrates a similar configuration to that shown in FIG. 7-1, except that the package structure includes two packages $702_1$ and $702_2$ and the wall structure 138 includes more than four partitions 140. The partitions 140 are laterally arranged in a discontinuous ring in the plan view and the semiconductor die 120 and the packages $702_1$ and $702_2$ are disposed within the discontinuous ring, in accordance with some embodiments. In some embodiments, the discontinuous ring has a rectangular-shaped profile with each side consisted of more than one partitions 140.

In some embodiments, each of the partitions 140 are separated from one another by a second distance D2 in a range from about 40 µm to about 200 µm. In some embodiments, each of the partitions 140 is separated from the semiconductor die 120 and/or the packages $702_1$ and/or $702_2$ adjacent thereto by a first distance D1 in a range from about 40 µm to about 200 µm.

FIG. 9-2 illustrates a similar configuration to that shown in FIG. 9-1, except that the package structure includes four packages $702_1$-$702_4$.

FIG. 9-3 illustrates a similar configuration to that shown in FIG. 9-1, except that the package structure includes six packages $702_1$-$702_6$.

FIG. 9-4 illustrates a similar configuration to that shown in FIG. 9-1, except that the package structure includes two semiconductor dies 120 and eight packages $702_1$-$702_8$.

FIG. 9-5 illustrates a similar configuration to that shown FIG. 9-1, except that some partitions (denoted as 140L) of the wall structure 138 disposed adjacent to the corners of the semiconductor die 120 and the packages 702 have L-shaped profile in the plan view.

In accordance with some embodiments, the flexibility of the process for disposing the wall structure 138 may be increased by adjusting by adjusting the shapes, the size and the configuration of the partitions 140.

As described above, the embodiments of the present disclosure provide a package structure which includes a wall structure 138. The wall structure 138 includes a plurality of partitions 140 which are separated from one another and from the semiconductor die 120 and laterally surrounding the semiconductor die 120. The wall structure 138 may reduce or mitigate the tensile stress induced by the bonding elements 136 and applied to the underfill material 146, thereby reducing the risk of cracking of the molding compound 148 and the underfill material 146. As a result, the performance and reliability of the package structure may be improved.

Embodiments of a package structure may be provided. The package structure may include a first semiconductor die bonded to a redistribution structure, a wall structure including a plurality of partitions separated from one another and laterally surrounding the first semiconductor die, and an underfill material between the first semiconductor die and the wall structure. Therefore, a stress applied to underfill material may be reduced or mitigated, which may improve the performance and reliability of the package structure.

In some embodiments, a package structure is provided. The package structure includes a semiconductor die bonding on a first surface of a redistribution structure through first bonding elements, and a wall structure bonding on the first surface of the redistribution structure through second bonding elements. The wall structure includes a plurality of partitions laterally arranged in a discontinuous ring, and the semiconductor die is located within the discontinuous ring. The package structure also includes a substrate on a second surface of the redistribution structure through third bonding elements and in electrical connection with the semiconductor die.

In some embodiments, a package structure is provided. The package structure includes a semiconductor die on a redistribution structure, and a wall structure on a redistribution structure. The wall structure includes a first partition disposed immediately adjacent to a first sidewall of the semiconductor die, and in a plan view, a length of the first partition is longer than the first sidewall of the semiconductor die, and a width of the first partition is shorter than the first sidewall of the semiconductor die. The package structure also includes an underfill material on the redistribution structure and surrounding the semiconductor die and a wall structure.

In some embodiments, a method for forming a package structure is provided. The method includes bonding a semiconductor die to a redistribution structure using first solder balls, and bonding a wall structure to the redistribution structure using second solder balls. The wall structure comprises a plurality of partitions surrounding the semiconductor die. The method also includes forming an underfill material to surround the semiconductor die and the wall structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a semiconductor die bonding on a first surface of a redistribution structure through first bonding elements;
    a wall structure bonding on the first surface of the redistribution structure through second bonding elements, wherein the wall structure includes a plurality of partitions laterally arranged in a discontinuous ring, and the semiconductor die is located within the discontinuous ring; and
    a substrate on a second surface of the redistribution structure through third bonding elements and in electrical connection with the semiconductor die, wherein:
    the semiconductor die has a first sidewall, a second sidewall connected to the first sidewall, a third sidewall opposite to the first sidewall and connected to the second sidewall, and a fourth sidewall opposite to the second sidewall and connected to the first and third sidewalls,
    a first partition in the plurality of partitions is located immediately adjacent to and spaced apart from the first sidewall of the semiconductor die by a first distance, a second partition in the plurality of partitions is located immediately adjacent to and spaced apart from the second sidewall of the semiconductor die by a second distance, a third partition in the plurality of partitions is located immediately adjacent to and spaced apart from the third sidewall of the semiconductor die by a third distance, and the first distance is equal to the second distance and the third distance, and
    the first partition is located immediately adjacent to and spaced apart from the second partition by a fourth distance, the second partition is located immediately adjacent to and spaced apart from the third partition by a fifth distance, and the fourth distance is equal to the fifth distance.

2. The package structure as claimed in claim 1, wherein the first distance is in a range from about 40 μm to about 200 μm.

3. The package structure as claimed in claim 1, wherein the fourth distance is in a range from about 40 μm to about 200 μm.

4. The package structure as claimed in claim 1, wherein the second bonding elements are solder balls.

5. The package structure as claimed in claim 1, further comprising:
    a plurality of the under-bump metallurgies interposing the wall structure and the first surface of the redistribution structure.

6. The package structure as claimed in claim 1, further comprising:
    a molding compound surrounding the wall structure and the semiconductor die, wherein top surfaces of the plurality of partitions and a top surface of the semiconductor die are exposed from the molding compound.

7. The method for forming the package structure as claimed in claim 1, wherein a fourth partition in the plurality of partitions is located immediately adjacent to and spaced apart from the fourth sidewall of the semiconductor die by a sixth distance, and the first distance is equal to the sixth distance, and the third partition is located immediately adjacent to and spaced apart from the fourth partition by a seventh distance, and the fourth distance is equal to the seventh distance.

8. The method for forming the package structure as claimed in claim 1, further comprising:
    an underfill material on the redistribution structure and surrounding the semiconductor die and the wall structure; and
    a molding compound surrounding the underfill material, wherein the first partition has a first sidewall facing the first sidewall of the semiconductor die and a second sidewall opposite to the first sidewall of the first partition, and a first interface between the molding compound and the underfill material intersects the second sidewall of the first partition.

9. The method for forming the package structure as claimed in claim 1, wherein a second interface between the molding compound and the underfill material intersects a top surface of the first partition.

10. The method for forming the package structure as claimed in claim 1, wherein the redistribution structure includes a conductive trace electrically isolated from the substrate and a conductive via on and in direct contact with the conductive trace, and the second bonding elements includes a microbump which is bonded to the first partition through a first under-bump metallurgy and bonded to the conductive via through a second under-bump metallurgy.

11. A package structure, comprising:
    a first semiconductor die and a second semiconductor die on a redistribution structure;
    a wall structure on a redistribution structure and surrounding the first semiconductor die and the second semiconductor die, wherein the wall structure includes a first partition disposed immediately adjacent to a first sidewall of the first semiconductor die, and in a plan view, a length of the first partition is longer than the first sidewall of the first semiconductor die, and a width of the first partition is shorter than the first sidewall of the first semiconductor die; and
    an underfill material on the redistribution structure and surrounding the semiconductor die and the wall structure, wherein:
    the first semiconductor die has a second sidewall facing a first sidewall the second semiconductor die and a third sidewall opposite to the second sidewall of the first semiconductor die, and the first sidewall of the first semiconductor die is connected to the second sidewall and the third sidewall of the first semiconductor die, and
    the first partition has a first sidewall facing the first sidewall of the first semiconductor die, a second sidewall aligned with the second sidewall of the first semiconductor die in a horizontal direction that is parallel to the second sidewall of the first partition and a third sidewall opposite to the second sidewall of the first partition, and the first sidewall of the first partition is connected to the second sidewall and the third sidewall of the first partition.

12. The package structure as claimed in claim 11, wherein:
    the wall structure further includes a second partition disposed immediately adjacent to a second sidewall of the second semiconductor die, and in a plan view, a length of the second partition is longer than the second sidewall of the second semiconductor die, and a width of the second partition is shorter than the second sidewall of the second semiconductor die.

13. The package structure as claimed in claim 11, wherein the wall structure is bonded on the redistribution structure through an adhesive tape.

14. The package structure as claimed in claim 11, further comprising:
a molding compound encapsulating the underfill material, wherein the first partition is in direct contact with the molding compound and the underfill material.

15. The method for forming the package structure as claimed in claim 11, wherein:
the first semiconductor die has a fourth sidewall opposite to the first sidewall of the first semiconductor die,
the wall structure further includes a second partition disposed immediately adjacent to the third sidewall of the first semiconductor die, and the second partition has a first sidewall facing the first sidewall of the first partition and a second sidewall opposite to the first sidewall of the second partition, and
the first sidewall and the second sidewall of the second partition are aligned to the first sidewall and the fourth sidewall of the first semiconductor die, respectively.

16. A method of forming a package structure, comprising:
bonding a semiconductor die and a plurality of packages to a redistribution structure using first solder balls;
bonding a wall structure to the redistribution structure using second solder balls, wherein the wall structure comprises a plurality of partitions surrounding the semiconductor die and the plurality of package; and
forming an underfill material to surround the semiconductor die and the wall structure, wherein:
the plurality of packages includes a first group on a first side of the semiconductor die, and the packages in the first group are arranged in a first direction,
the plurality of partitions includes a second group immediately adjacent to the first group of the plurality of packages, and the partitions in the second group are arranged in the first direction,
each of the partitions in the second group has a length extending in the first direction and a width extending in a second direction that is perpendicular to the first direction, and the length is longer than the width, and
a first number of the packages in the first group is less than a second number of the partitions in the second group.

17. The method for forming the package structure as claimed in claim 16, wherein a first partition in the plurality of partitions is bonded to the redistribution structure using at least two second solder balls.

18. The method for forming the package structure as claimed in claim 16, wherein the underfill material extends between the wall structure and the redistribution structure and is in direct contact with the second solder balls.

19. The method for forming the package structure as claimed in claim 16, wherein the second group of the partitions includes a first partition, a second partition located immediately adjacent to and spaced apart from the first partition by a first distance, and a third partition located immediately adjacent to and spaced apart from the second partition by a second distance, and the first distance is equal to the second distance.

20. The method for forming the package structure as claimed in claim 19, wherein:
the plurality of partitions includes a third group immediately adjacent to a second side of the semiconductor die, and the partitions in the third group are arranged in the second direction, and
the third group of the partitions includes a fourth partition immediately adjacent to and spaced apart from the first partition by a third distance, and the third distance is equal to the first distance.

* * * * *